(12) United States Patent
Park

(10) Patent No.: US 7,732,850 B2
(45) Date of Patent: Jun. 8, 2010

(54) SEMICONDUCTOR DEVICE INCLUDING AN IMPROVED CAPACITOR AND METHOD FOR MANUFACTURING THE SAME

(75) Inventor: Je-Min Park, Gyeonggi-do (KR)

(73) Assignee: Samsung Electronics Co., Ltd., Gyeonggi-do (KR)

(\*) Notice: Subject to any disclaimer, the term of this patent is extended or adjusted under 35 U.S.C. 154(b) by 45 days.

(21) Appl. No.: 12/252,162

(22) Filed: Oct. 15, 2008

(65) Prior Publication Data

US 2009/0039403 A1 Feb. 12, 2009

Related U.S. Application Data

(60) Division of application No. 11/687,568, filed on Mar. 16, 2007, now Pat. No. 7,452,769, which is a continuation of application No. 11/000,782, filed on Nov. 30, 2004, now Pat. No. 7,247,537, which is a continuation-in-part of application No. 10/916,672, filed on Aug. 11, 2004, now Pat. No. 7,126,180.

(30) Foreign Application Priority Data

Aug. 18, 2003 (KR) ................ 2003-56959
Dec. 1, 2003 (KR) ................ 2003-86462

(51) Int. Cl.
*H01L 27/108* (2006.01)
*H01L 29/94* (2006.01)

(52) U.S. Cl. ............... 257/303; 257/906; 257/E27.084; 257/E21.646

(58) Field of Classification Search .......... 257/68, 257/71, 303–305, 311, 906, E27.084, E21.646
See application file for complete search history.

(56) References Cited

U.S. PATENT DOCUMENTS

| 2003/0085420 | A1 | 5/2003 | Ito et al. |
| 2003/0121132 | A1* | 7/2003 | Oh et al. ................ 29/29 |
| 2003/0235946 | A1 | 12/2003 | Lee et al. |

FOREIGN PATENT DOCUMENTS

| JP | 11-251540 | 9/1999 |
| KR | 2002-0073942 | 9/2002 |
| KR | 2003-0075907 | 9/2003 |
| KR | 2004-0060081 | 7/2004 |

\* cited by examiner

*Primary Examiner*—Davienne Monbleau
*Assistant Examiner*—Monica D Harrison
(74) *Attorney, Agent, or Firm*—Harness, Dickey & Pierce

(57) ABSTRACT

In a semiconductor device according to embodiments of the invention, a capacitor includes a storage electrode having a cylindrical storage conductive layer pattern and connecting members formed on the upper portion of the cylindrical storage conductive layer pattern. The connecting member connects to an adjacent connecting member of another storage electrode. A dielectric layer and a plate electrode are successively formed on the storage electrode. All of the capacitors are connected by one another by forming cylindrical storage electrodes so that the storage electrode does not fall down when the capacitors have an extremely large aspect ratio. Thus, the capacitance of the capacitors may be improved to the desired level. A semiconductor device that includes these capacitors may have improved reliability and the throughput of a semiconductor manufacturing process may be increased.

13 Claims, 27 Drawing Sheets

SEMICONDUCTOR DEVICE INCLUDING AN IMPROVED CAPACITOR AND METHOD FOR MANUFACTURING THE SAME

CROSS REFERENCE TO RELATED APPLICATIONS

This application is a Divisional of U.S. patent application Ser. No. 11/687,568, filed on 16 Mar. 2007, now pending, which is a Continuation of U.S. patent application Ser. No. 11/000,782, filed on 30 Nov. 2004, issued on 24 Jul. 2007 as U.S. Pat. No. 7,247,537, which is a CIP of U.S. patent application Ser. No. 10/916,672, filed on 11 Aug. 2004, issued on 24 Oct. 2006 as U.S. Pat. No. 7,126,180, which also claims priority from Korean Patent Application Nos. 2003-86462, filed on 1 Dec. 2003, and 2003-56959, filed on 18 Aug. 2003, the contents of which are herein incorporated by reference in their entirety for all purposes.

BACKGROUND OF THE INVENTION

1. Field of the Invention

This disclosure relates to semiconductor devices, and more particularly to a semiconductor device that includes a capacitor having an improved structural stability and an enhanced capacitance, and a method of manufacturing the semiconductor device.

2. Description of the Related Art

In general, semiconductor memory devices such as dynamic random access memory (DRAM) devices can store data or information therein. The data or information may be stored to as well as read out from the semiconductor memory devices. A typical single unit memory cell of the semiconductor memory device includes one capacitor and one transistor. The capacitor typically includes a storage electrode, a dielectric layer, and a plate electrode. To improve a storage capacitance of the semiconductor memory device, a capacitor having a high capacitance is required.

As the semiconductor memory device becomes highly integrated, the area of the unit memory cell is reduced. To ensure a sufficient storage capacitance of the semiconductor memory device, the capacitor may have various shapes such as a box, a cylinder, etc. However, as the design rules for semiconductor memory devices rapidly decrease, the aspect ratio of the capacitor increases because the capacitor must be formed in a correspondingly smaller unit area of the semiconductor memory device. The aspect ratio is defined as the ratio between a height of the capacitor and a width of the capacitor. As a result, adjacent capacitors having high aspect ratios may lean against each other, causing them to become electrically connected and generating a two-bit short between the adjacent capacitors.

To overcome the above problem, a semiconductor memory device and a method of manufacturing the same, which are capable of improving a mechanical strength of a capacitor by connecting lower electrodes to each other using an insulation member having a beam shape, are disclosed in U.S. Patent Application Publication No. 2003-85420.

FIG. 1A is a cross-sectional diagram illustrating a semiconductor device that was disclosed in U.S. Patent Application Publication No. 2003-85420. FIG. 1B is a plan diagram further illustrating the semiconductor device of FIG. 1A.

Referring to FIGS. 1A and 1B, an isolation layer 13 is formed on a substrate 10 to divide the substrate 10 into an active region and a field region. Gate structures 22 are formed in the active region of the semiconductor substrate 10. Each of the gate structures 22 includes a gate oxide layer pattern, a gate electrode, and a mask pattern.

Impurities are implanted into a surface of the semiconductor substrate 10 by an ion implantation process using the gate structures 22 as a mask to form source/drain regions 16 and 19 at the surface portions of the substrate 10 between the gate structures 22. Thus, metal oxide semiconductor (MOS) transistors are formed on the semiconductor substrate 10.

A first insulating interlayer 37 is formed on the substrate 10 and the MOS transistors. Capacitor plugs 25 and a bit line plug 28 are formed through the first insulating interlayer 37. The capacitor plugs 25 and the bit line plug 28 are connected to the source/drain regions 16 and 19, respectively.

A second insulating interlayer 40 is formed on the first insulating interlayer 37. The second insulating interlayer 40 is partially etched to form a bit line contact plug 31 making contact with the bit line plug 28. A third insulating interlayer 43 is formed on the second insulating interlayer 40. The third and second insulating interlayers 43 and 40 are successively etched to form capacitor contact plugs 34 making contact with the capacitor plugs 25, respectively.

An etching stop layer 46 is formed on the third insulating interlayer 43 and the capacitor contact plugs 34. Holes 49 that expose the capacitor contact plugs 34 are formed through the etching stop layer 46. Cylindrical bottom electrodes 52 that make contact with the capacitor contact plugs 34 are formed in the holes 49, respectively. Here, the cylindrical bottom electrodes 52 are electrically connected to the source/drain regions 16 through the capacitor contact plugs 34 and the capacitor plugs 25.

Beam-shaped insulating members 64 are formed between sidewalls of adjacent bottom electrodes 52. Dielectric layers 55 and top electrodes 58 are successively formed on the bottom electrodes 52 to thereby form capacitors 61 on the semiconductor substrate 10.

An additional insulation layer is formed over the substrate 100 to cover the capacitors 61. Since the beam-shaped insulating members 64 are formed between the sidewalls of the adjacent bottom electrodes 52, the mechanical strength of the capacitor may be improved.

However, in the above-described semiconductor device, the processes for manufacturing the semiconductor device may be complicated because a plurality of beam-shaped insulating members 64 should be formed between the adjacent bottom electrodes 52, although the mechanical strength of the capacitor 61 may be improved through the beam-shaped insulating member 64. Thus, cost and time for manufacturing the semiconductor device may be increased. Additionally, the manufacturing processes may be more complicated because the capacitor 61 has a complex structure including the bottom electrode 52, the beam-shaped insulating members 64, the dielectric layer 55, and the top electrode 58. Furthermore, the additional insulation layer may not be precisely formed between the capacitors 61 having the complex structure so that the capacitors 61 may be electrically connected to an upper wiring 67 formed on the capacitors 61. As a result, the processes for manufacturing the semiconductor device including the capacitor 61 having the complex structure may have poor throughput.

Embodiments of the invention address these and other disadvantages of the conventional art.

SUMMARY OF THE INVENTION

According to some embodiments of the invention, a capacitor may have an improved structural stability by using a simple connecting member and an enhanced capacitance by expanding an inner area of the capacitor.

BRIEF DESCRIPTION OF THE DRAWINGS

The above and other features and advantages of the invention will become readily apparent by reference to the following detailed description of several exemplary embodiments of the invention and to the following accompanying drawings.

DETAILED DESCRIPTION OF THE INVENTION

The invention will be described more fully below with reference to the accompanying drawings.

Figure 1A:
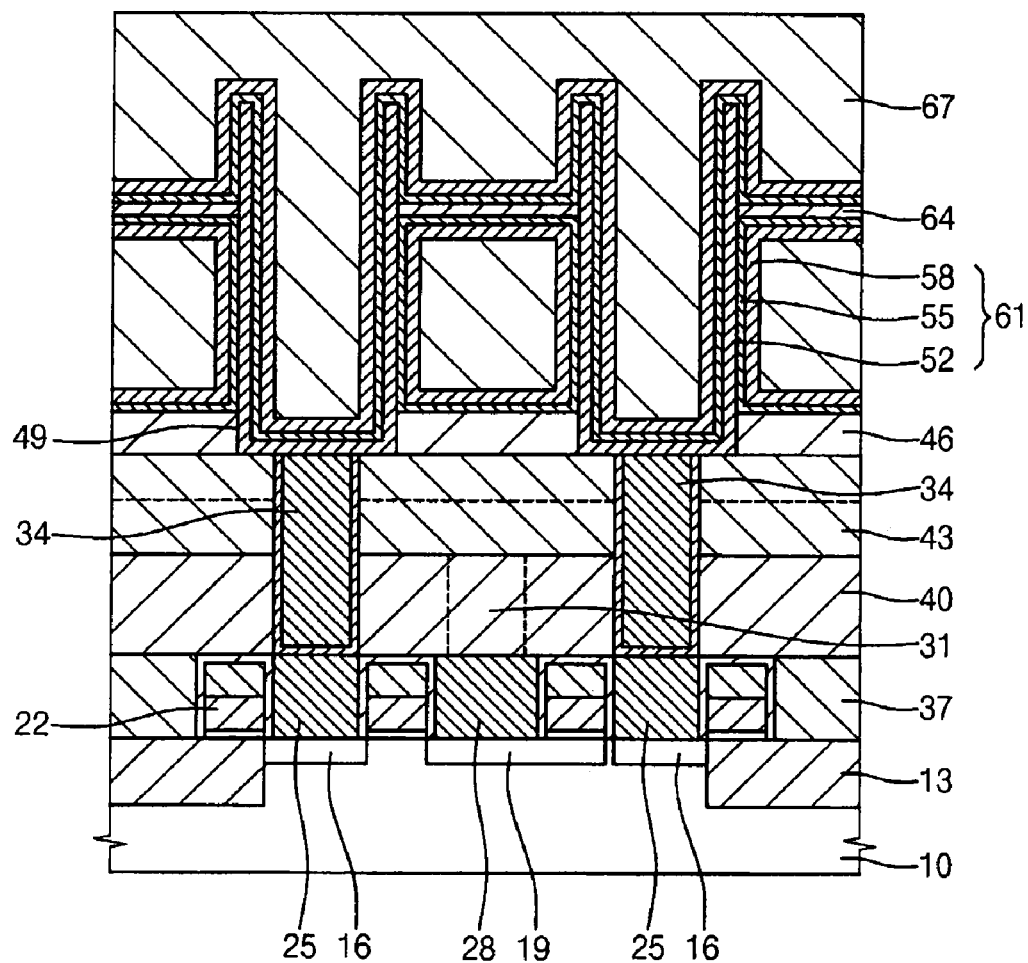
FIG. 1A is a cross-sectional diagram illustrating a conventional semiconductor device including a cylindrical capacitor.
Figure 1B:
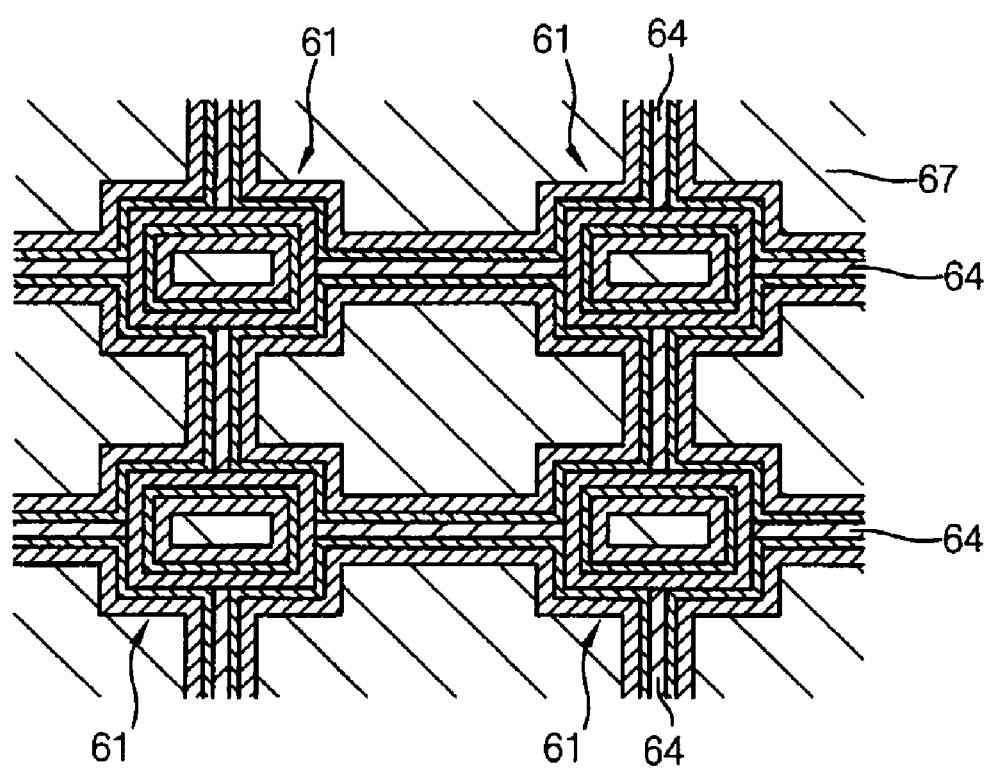
FIG. 1B is a plan diagram illustrating the semiconductor device in FIG. 1A.
Figure 2A:
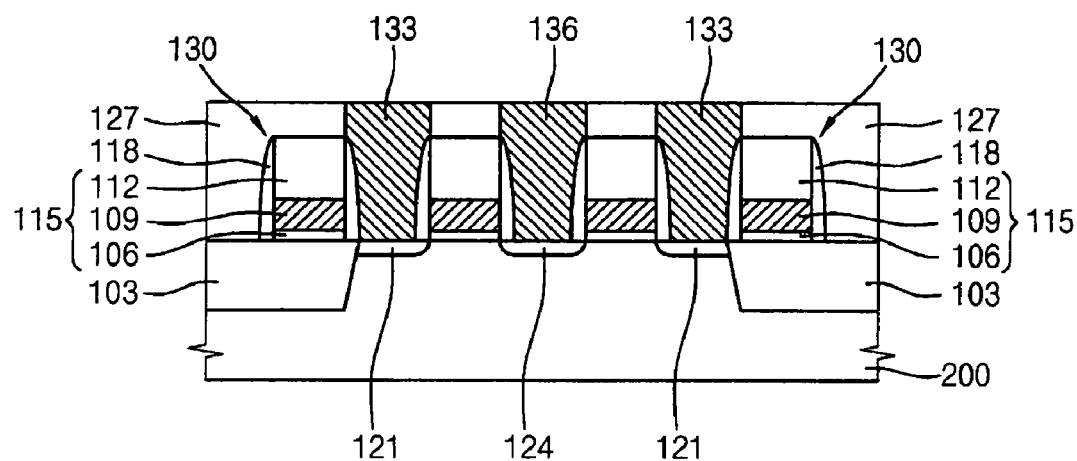
FIGS. 2A, 3A, 4A, 5A, 6A, 7A, 8A, 9A, 10A, 11A, and 13A are cross-sectional diagrams taken along a line that is parallel to the bit lines that illustrate a semiconductor device in accordance with some embodiments of the invention.
Figure 2B:
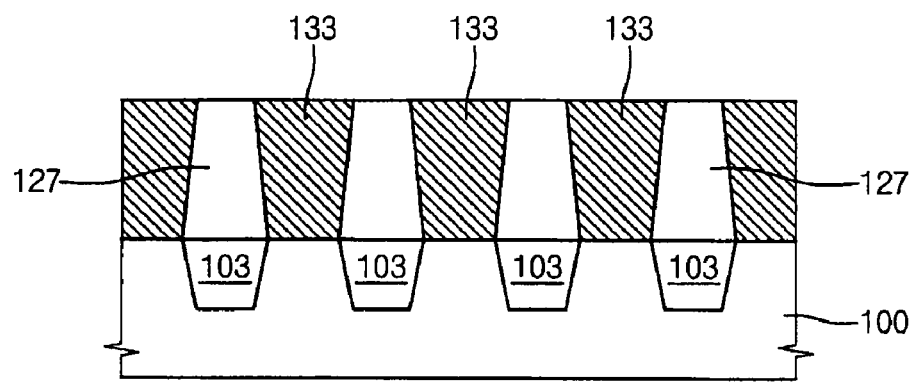
FIGS. 2B, 3B, 4B, 5B, 6B, 7B, 8B, 9B, 10B, 11B, and 13B are cross-sectional diagrams taken along a line that is parallel to the word lines that illustrate the semiconductor device in accordance with some embodiments of the invention.

FIGS. 2A and 2B are cross-sectional diagrams that illustrate processes for forming first pads 121 and second pads 124 on a semiconductor substrate 100 including word lines 130.

Referring to FIGS. 2A and 2B, an isolation layer 103 is formed at a surface portion of a substrate 100 to define an active region and a field region on the substrate 100. The isolation layer 103 may be formed via a shallow trench isolation (STI) process or a local oxidation of silicon (LOCOS) process.

A thin gate oxide layer (not shown) is formed on the substrate 100 by a thermal oxidation process or a chemical vapor deposition (CVD) process. Here, the gate oxide layer is formed only on the active region defined by the isolation layer 103.

A first conductive layer (not shown) and a first mask layer (not shown) are formed successively on the gate oxide layer. The first conductive layer and the first mask layer correspond to a gate conductive layer and a gate mask layer, respectively. The first conductive layer may include polysilicon doped with impurities. The first conductive layer is patterned in a subsequent process to form a gate conductive pattern 109. Alternatively, the first conductive layer may have a polycide structure that includes a doped polysilicon film and a metal silicide film formed thereon.

The first mask layer is patterned in a subsequent process to form a gate mask 112. The first mask layer may be formed using a material that has an etching selectivity with respect to a first insulating interlayer 127. For example, when the first insulating interlayer 127 includes oxide, the first mask layer may include a nitride such as silicon nitride.

A first photoresist pattern (not shown) is formed on the first mask layer. The first mask layer, the first conductive layer, and the gate oxide layer are etched using the photoresist pattern as an etching mask to form gate structures 115 including the gate oxide pattern 106, the gate conductive pattern 109, and the gate mask 112 on the semiconductor substrate 100. That is, the first mask layer, the first conductive layer, and the gate oxide layer are etched successively to thereby form gate structures 115 on the semiconductor substrate 100.

Alternatively, the first mask layer is etched using the first photoresist pattern as an etching mask so that the gate mask 112 is formed on the first conductive layer. The first photoresist pattern is then removed. The first conductive layer and the gate oxide layer are etched successively using the gate mask 112 as an etching mask to form the gate structure 115 including the gate oxide pattern 106, the gate conductive pattern 109, and the gate mask 112 on the semiconductor substrate 100.

A first insulation layer is formed on the semiconductor substrate 100 to cover the gate structures 115. The first insulation layer may be formed using a nitride such as silicon nitride. The first insulation layer is anisotropically etched to form first spacers 118 on the sidewalls of the gate structures 115. The first spacers 118 correspond to gate spacers. As a result, a number of word lines 130 that are parallel with each other is formed on the semiconductor substrate 100. Here, adjacent word lines 130 on the active region are electrically separated from each other by the first spacers 118 that are formed on sidewalls of the word lines 130. That is, since the gate mask 112 is formed on surface of the word lines 130 and the first spacers 118 are formed on the sidewalls of the word line, the adjacent word lines 130 are electrically separated from each other.

Impurities are implanted into surface portions of the semiconductor substrate 100 exposed between the word lines 130 by an ion implantation process using the word lines 130 as an ion implantation mask. The substrate 100 is thermally treated to thereby form first and second contact regions 121 and 124 at the exposed surface portions of the semiconductor substrate 100. The first and second contact regions 121 and 124 correspond to source/drain regions of the transistors. As a result, MOS transistors having the gate structures 115 and the first and second contact regions 121 and 124 are formed on the semiconductor substrate 100. Here, the first and second contact regions 121 and 124 also correspond to capacitor contact regions and bit line contact regions, respectively. Capacitors 205 (see FIGS. 13A and 13B) are electrically connected to the capacitor contact regions, whereas bit lines 154 (see FIGS. 4A and 4B) are electrically connected to the bit line contact regions. For example, the first contact regions 121 are the capacitor regions with which first pads 133 make contact, whereas the second contact regions 124 are the bit line contact regions with which second pads 136 make contact.

The first insulating interlayer 127 is formed on the semiconductor substrate 100 to cover the MOS transistors. The first insulating interlayer 127 may include oxide such as borophosphor silicate glass (BPSG), phosphor silicate glass (PSG), undoped silicate glass (USG), spin on glass (SOG), high density plasma-chemical vapor deposition (HDP-CVD) oxide, etc.

The first insulating interlayer 127 is planarized by a chemical mechanical polishing (CMP) process, an etch-back process, or a combination of CMP process and the etch back process. Here, the planarized first insulating interlayer 127 has a predetermined thickness that is measured from upper faces of the word lines 130. Alternatively, the first insulating interlayer 127 is etched until the upper face of the word lines 130 is exposed.

A second photoresist pattern (not shown) is formed on the planarized first insulating interlayer 127. The first insulation interlayer 127 is partially and anisotropically etched using the second photoresist pattern as an etching mask to form first contact holes (not shown) that expose the first and second contact regions 121 and 124. Preferably, the first insulating interlayer 127 that includes oxide is etched using an etching gas that has an etching selectivity (or a higher etching rate) with respect to the gate mask 112 that includes nitride. Hence, the first contact holes are formed through the first insulating interlayer 127 by a self-alignment process. That is, the first contact holes are self-aligned relative to the word lines 130. Here, some first contact holes expose the first contact regions 121 corresponding to the capacitor contact regions, and other first contact holes expose the second contact region 124 corresponding to the bit line contact regions.

The second photoresist pattern is removed by an ashing process and/or a stripping process. A second conductive layer (not shown) is formed on the first insulating interlayer 127 to fill the first contact holes. The second conductive layer may be formed using conductive material such as a doped polysilicon, metal, etc.

The second conductive layer is etched until the first insulating interlayer 127 is exposed. Thus, the first and second contact pad 133 and 136 that fill the first contact holes are formed on the first and second contact regions 121 and 124, respectively. Each of the first pads 133 corresponds to a first storage node contact pad, and each of the second pads 136 corresponds to a first bit line contact pad. Since the first contact holes are formed by the self-alignment process, the first and second pads 133 and 136 correspond to self-aligned contact (SAC) pads.

As described above, the first pads 133 make contact with the first contact regions 121 corresponding to the capacitor contact region, and the second pads 136 make contact with the second contact regions 124 corresponding to the bit line contact regions. When the first insulating interlayer 127 is planarized until the upper faces of the word lines 130 are exposed, the second conductive layer is etched until the upper faces of the word lines 130 are exposed so that the first and second pads 133 and 136 are formed in the first contact holes. Here, the first and second pads 133 and 136 have heights that are substantially identical to those of the word lines 130.

Figure 3A:
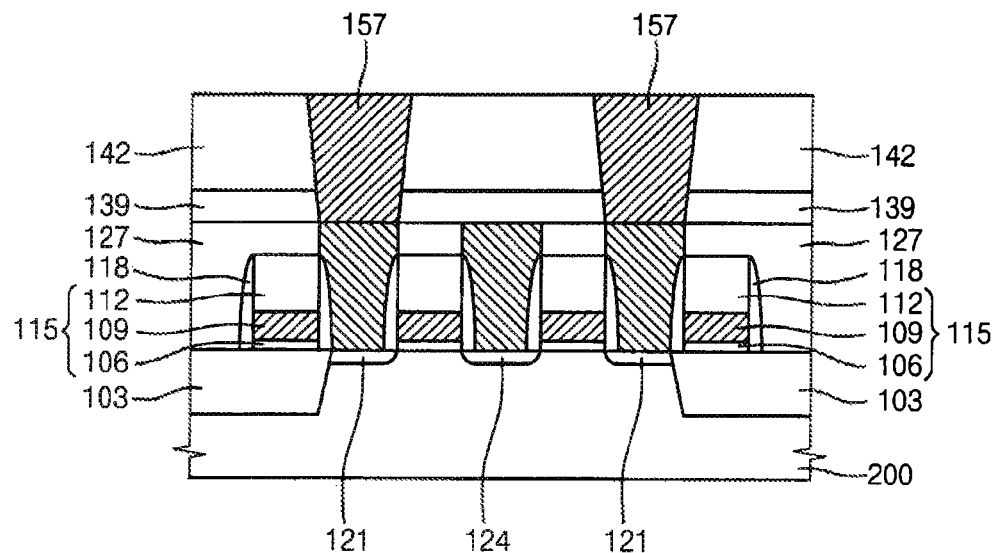
Figure 3B:
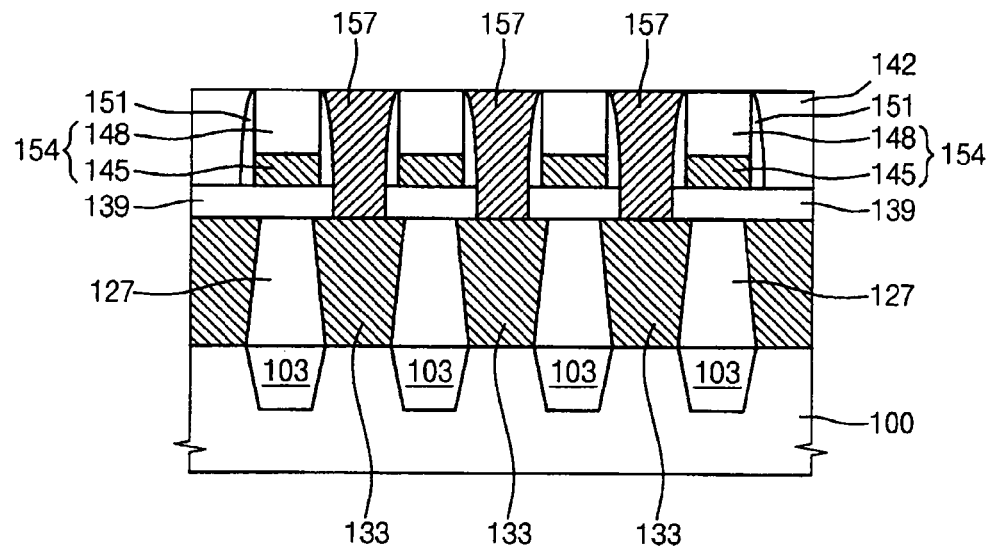

FIGS. 3A and 3B are cross-sectional diagrams illustrating processes for forming bit lines 154 and a fourth pad 157 on the semiconductor substrate 100.

Referring to FIGS. 3A and 3B, a second insulating interlayer 139 is formed on the first insulating interlayer 127 including the first and second pads 133 and 136. The second insulating interlayer 139 electrically isolates the first pad 133 from the bit lines 154 that are successively formed on the second insulating interlayer 139. The second insulating interlayer 139 may be formed using an oxide such as BPSG, PSG, SOG, USG, HDP-CVD oxide, etc. The first insulating interlayer 137 may include any one of the above materials and may be substantially identical to the material used for the second insulating interlayer 139. Alternatively, the second insulating interlayer 139 may be of a different material from that of the first insulating interlayer 127.

The second insulating interlayer 139 is planarized by a CMP process, etch back process, or a combination of the CMP process and the etch back process.

A third photoresist pattern (not shown) is formed on the planarized second insulating interlayer 139. The second insulating interlayer 139 is partially etched using the third photoresist pattern as an etching mask to form second contact holes (not shown) that expose the second pad 136. The second contact holes correspond to bit line contact holes that are used for electrically connecting the second pads 136 to the bit lines 154, respectively.

In one embodiment of the invention, a first anti-reflection layer (ARL) is additionally formed between the second insulation interlayer 139 and the third photoresist pattern. The first ARL may be formed using silicon oxide, silicon nitride, silicon oxynitride, etc. Then, the second contact holes may be formed through the second insulating interlayer 139 by a photolithography process.

After removing the third photoresist pattern by an ashing and/or stripping process, a third conductive layer (not shown) and a second mask layer (not shown) are successively formed on the second insulating interlayer 139. Here, the second contact holes are filled with the third conductive layer. The third conductive layer and the second mask layer will be patterned to form bit line conductive patterns 145 and a bit line mask 148, respectively.

A fourth photoresist pattern (not shown) is formed on the second mask layer. The second mask layer and the third conductive layer are successively etched using the fourth photoresist pattern as an etching mask to thereby form the bit lines 154 on the second insulating interlayer 139. Here, third pads (not shown) that fill the second contact holes are simultaneously formed. Each of the bit lines 154 includes the bit line conductive pattern 145 and bit line mask 148. The third pads correspond to second bit line contact pads that electrically connect the second pads 136 to the bit lines 154.

Each of the bit line conductive patterns 145 may include a first film and a second film formed on the first film. The first film may include a metal or a metal compound such as titanium (Ti) or titanium nitride (TiN), and the second film may include a metal such as tungsten (W).

Figure 8A:
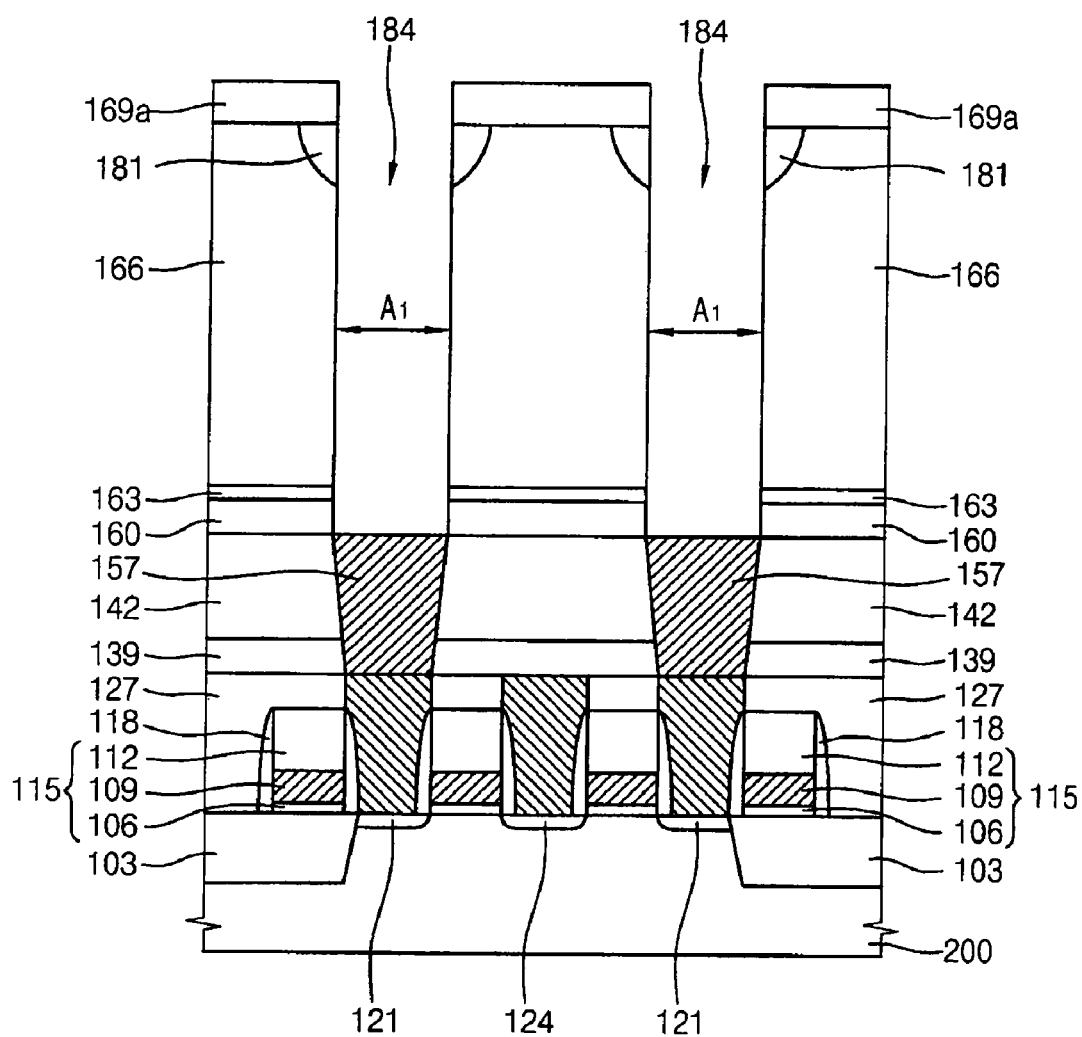
Figure 8B:
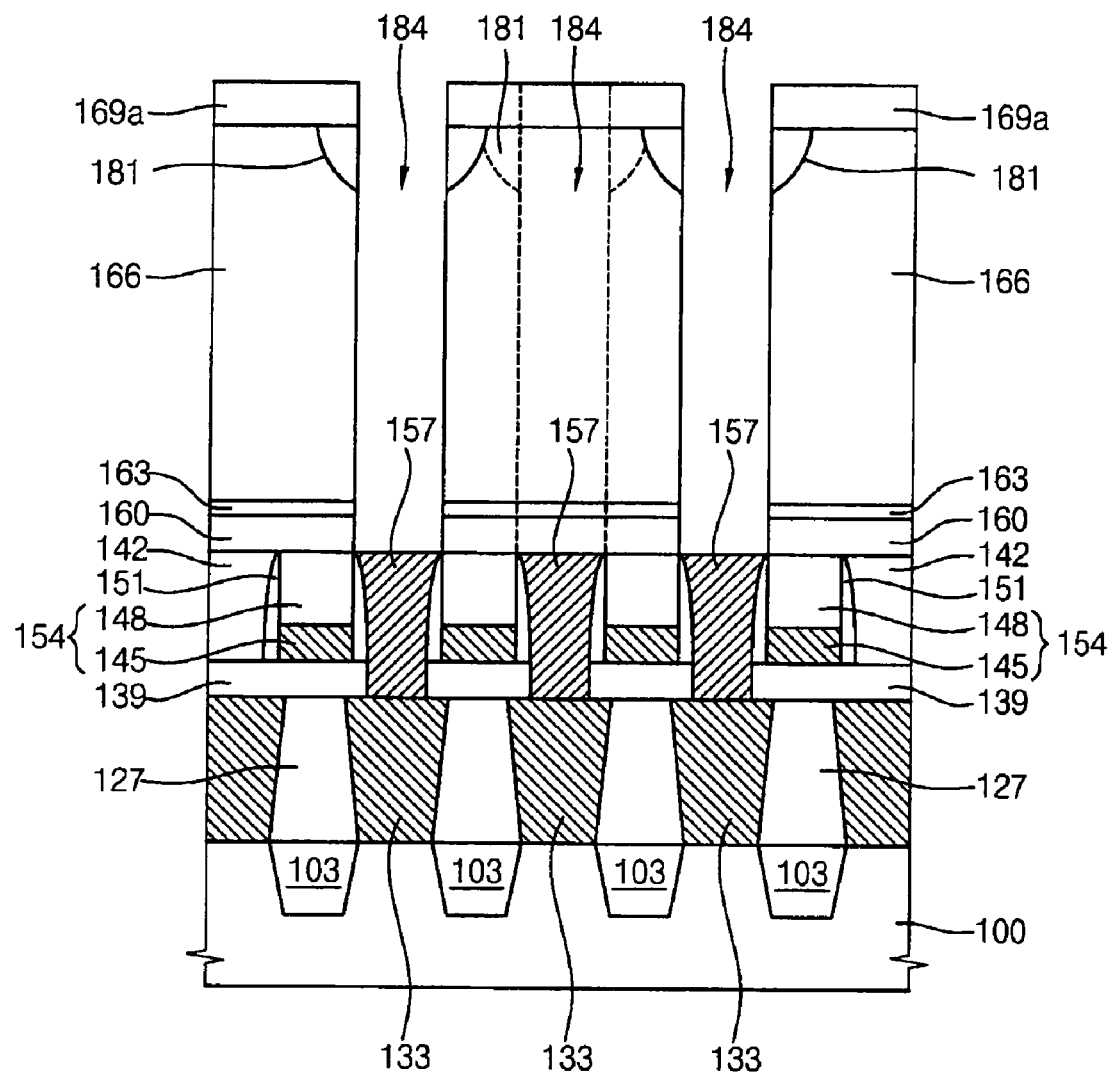
Figure 8C:
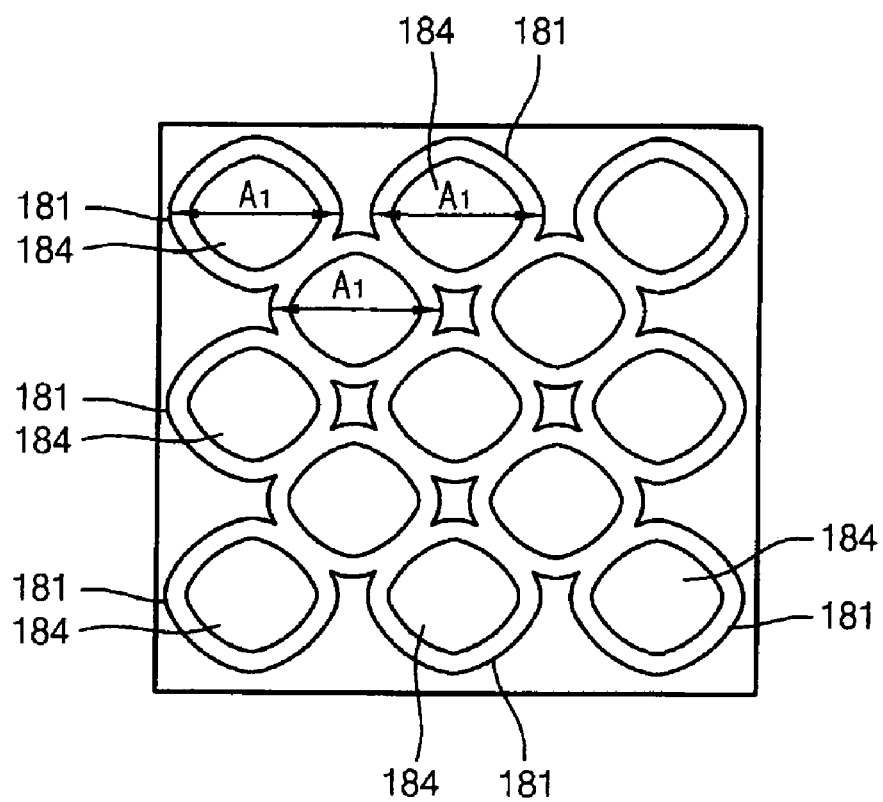

Each of the bit line masks 148 protects the corresponding bit line conductive patterns 145 in an etching process for forming a fourth contact hole 184 (refer to FIGS. 8A to 8C). The bit line mask is formed using a material that has an etching selectivity with respect to oxide in a fourth insulating interlayer 160 and a mold layer 166 (see FIGS. 4A and 4B). For example, the bit line mask 148 is formed using a nitride such as silicon nitride.

In one embodiment of the invention, the second mask layer is patterned using the fourth photoresist pattern as an etching mask to form the bit line mask 148 on the third conductive layer. Then, after removing the fourth photoresist pattern, the third conductive layer is patterned using the bit line mask an as etching mask to thereby form the bit line conductive pattern 145 on the second insulating interlayer 139. Here, the third pads are formed simultaneously in the second contact holes to electrically connect the bit line conductive patterns 145 to the second pads 136.

In one embodiment of the invention, after an additional conductive layer is formed on the second insulating interlayer 139 to fill the second contact holes, the additional conductive layer is etched until the second insulating interlayer 139 is exposed. Hence, the third pads that contact the second pads 136 are formed in the second contact holes. Subsequently, the third conductive layer and the second mask layer are formed on a portion of the second insulating interlayer 139 in which the third pads are formed. The third conductive layer and the second mask layer are patterned to form the bit lines 154 as described above. In particular, a metal barrier layer and a metal layer are successively formed on the second insulating interlayer 139 to fill the second contact holes. The metal barrier layer may be formed using titanium or titanium nitride, and the metal layer may be formed using tungsten. The metal and barrier metal layers may be etched by a CMP process, an etch back process, or a combination process of CMP and etch back until the second insulating interlayer 139 is exposed. Thus, the third pads are formed in the second contact holes. After the third conductive layer and the second mask layer are formed on the second insulating interlayer and on the third pads, the third conductive layer and the second mask layer are patterned to form the bit lines 154 including the bit line conductive patterns 145 and the bit line mask 148. Here, each of the bit line conductive patterns 145 includes a single metal layer.

A second insulation layer (not shown) is formed on the second insulating interlayer 139 to cover the bit lines 154. The second insulation layer is anisotropically etched to form second spacers 151 on sidewalls of the bit lines 154. The second spacers 151 correspond to a bit line spacers. The second spacers 151 protect the bit lines 154 in a subsequent etching process for forming a fourth pads 157 that correspond to second storage node contact pads. The second spacers 151 may include material that has an etching selectivity with respect to the second insulating interlayer 139 and a third insulating interlayer 142. For example, the second spacers 151 include nitride such as silicon nitride.

The third insulating interlayer 142 is formed on the second insulating interlayer 139 to cover the bit lines 154 including the second spacers 151. The third insulating interlayer 142 may be formed using an oxide such as BPSG, PSG, SOG, USG, HDP-CVD oxide, etc. As described above, the third insulating interlayer 142 may be formed using the same material as that of the second insulating interlayer 139. Alternatively, the third insulating interlayer 142 may include material that is different from that of the second insulating interlayer 139.

The third insulating interlayer 142 may be etched by a CMP process, an etch back process, or a combination process of CMP and etch back until the upper faces of the bit line 154 is exposed, thereby planarizing the third insulating interlayer 142. In one embodiment of the invention, the third insulating interlayer 142 may be planarized without exposing the bit lines 154. Hence, the third insulating interlayer 142 has a predetermined height measured from the upper faces of the bit lines 154. In one embodiment of the invention, to prevent generation of voids in the third insulating interlayer 142 between adjacent bit lines 154, an additional insulation layer may be formed on the second insulating interlayer 142 including the bit lines 154. Then, the third insulating interlayer 142 is formed on the additional insulation layer. Here, the additional insulation layer may have a thickness of about 50 Å to about 200 Å. The additional insulation layer may be formed using nitride.

A fifth photoresist pattern (not shown) is formed on the planarized second insulating interlayer 142. The third insulating interlayer 142 and the second insulating interlayer are partially etched using the fifth photoresist pattern as an etching mask. Thus, third contact holes (not shown) are formed through the third insulating interlayer 142 and the second insulating interlayer 139. The third contact holes expose the first pads 133. The third contact holes correspond to first storage node contact holes. Here, the third contact holes are formed to be self-aligned relative to the second spacers 151 positioned on the sidewalls of the bit lines 154. In one embodiment of the invention, a second ARL layer may be formed additionally on the third insulating interlayer 142 to ensure process margin of a subsequent photolithography process. In another embodiment of the invention, after forming the third contact holes corresponding to the first storage node contact holes, an additional cleaning process may be performed on the semiconductor substrate 200. As a result, a native oxide layer or various particles existing on the first pads 133 may be removed from the first pads 133.

A fourth conductive layer is formed on the third insulating interlayer 142 to fill up the third contact holes. The fourth conductive layer may be etched by a CMP process, an etch back process, or a combination process of CMP and etch back until the third insulating interlayer 142 and the bit lines 154 are exposed. Thus, fourth pads 157 that fill up the third contact holes are formed. The fourth pads 157 correspond to the second storage node contact pads. The fourth pads 157 are generally formed using doped polysilicon. Each of the fourth pads is electrically connected between the first pads 133 and a storage electrode 196 (see FIGS. 13A and 13B) that is subsequently formed on the fourth pad 157. Hence, the storage electrodes 360 are connected electrically to the first contact region 121 through the fourth pads 157 and the first pads 133.

Figure 4A:
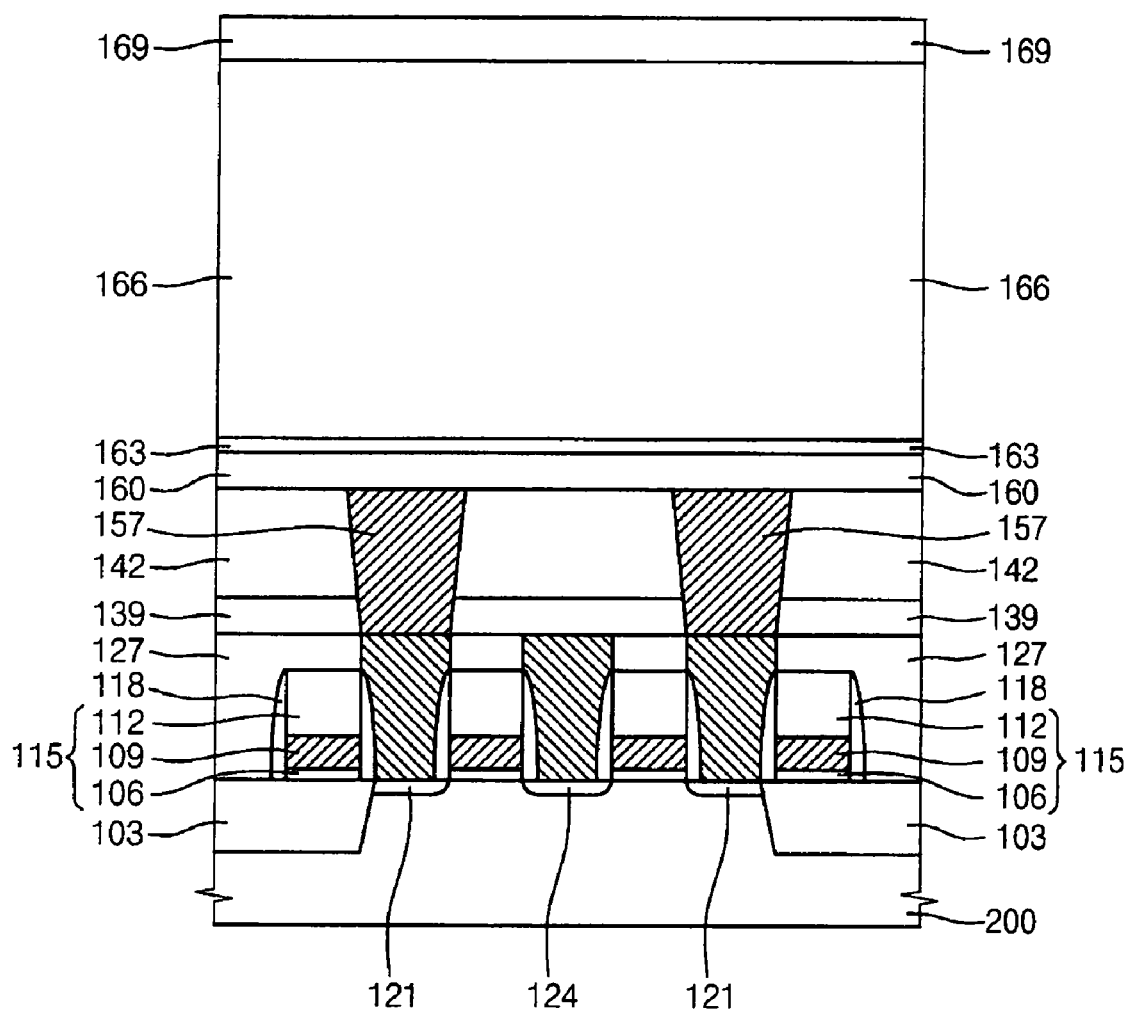
Figure 4B:
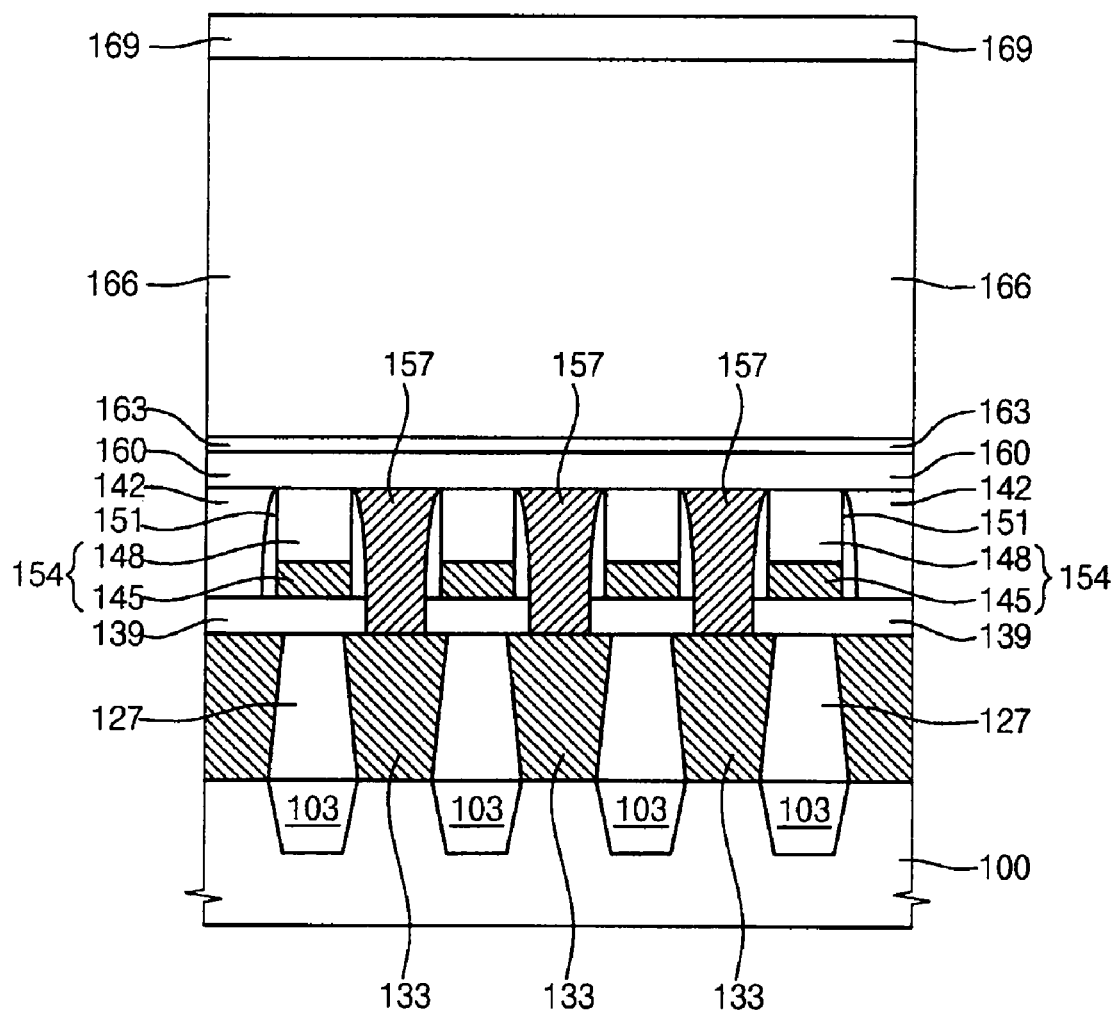

FIGS. 4A and 4B are cross-sectional diagrams illustrating exemplary processes for forming a mold layer 166 and a third mask layer 169.

Referring to FIGS. 4A and 4B, a fourth insulating interlayer 160 is formed on the fourth pads 157 and the third insulating interlayer 142. The fourth insulating interlayer 160 may be formed using an oxide such as BPSG, PSG, USG, SOG, HDP-CVD oxide, etc. The fourth insulating interlayer 160 electrically isolates the bit lines 154 from the storage electrodes 196. As described above, the fourth insulating interlayer 160 may be formed using same material as the third insulating interlayer 142 and/or that of the second insulating interlayer 139. Alternatively, the fourth insulating interlayer 160 may be formed using a material different from that of the third insulating interlayer 142 and/or that of the second insulating interlayer 139.

An etching stop layer is formed on the fourth insulating interlayer 160. The etching stop layer may be formed using a material having an etching selectivity with respect to the fourth insulating interlayer 160 and the mold layer 166. For example, the etching stop layer may include a nitride such as silicon nitride. After the fourth insulating interlayer 160 may be planarized by a CMP process, an etch back process or a combination process of CMP and etch back, the etching stop layer 163 may be formed on the planarized fourth insulation interlayer 160.

The mold layer 166 is formed on the etching stop layer 163. The mold layer 166 is provided to form the storage electrode 196. The mold layer 166 may be formed using an oxide such as HDP-CVD oxide, USG, BPSG, PSG, SOG, etc. The mold layer has a thickness of about 5,000 to about 50,000 Å measured from an upper face of the etching stop layer 163. According to embodiments of the invention, the thickness of the mold layer 166 may vary in accordance with the desired capacitance of capacitors 205 (see FIGS. 13A and 13B). That is, because the capacitor 205 has a height in proportion to the thickness of the mold layer 166, the thickness of the mold layer 166 may be advantageously adjusted so as to control the capacitance of the capacitor 205. According to embodiments of the invention, since the connecting members 181 are provided to greatly improve structural stability of the capacitors 205, the capacitor 205 may achieve a very high height without danger that the capacitors 205 will fall down. Namely, although the capacitors 205 may have an extremely large aspect ratio, the capacitors 205 are prevented from falling toward each other because the connecting members 181 are positioned at upper potions of the capacitors 205. Therefore, each of the capacitors 205 may have a greatly enhanced capacitance in comparison with a conventional capacitor.

Referring to FIGS. 4A and 4B, the third mask layer 169 is formed on the mold layer 166. The third mask layer 169 may be formed using a material that has an etching selectivity with respect to the mold layer 166 of oxide. For example, the third mask layer 169 includes polysilicon or nitride such as silicon nitride.

The third mask layer has a thickness of about 100 to about 6,000 Å measured from an upper face of the mold layer 166. Hence, a ratio of the thickness of the mold layer 166 with respect to that of the third mask layer 169 may be in a range of about 8:1 to about 50:1. However, a thickness ratio between the mold layer 166 and the third mask layer 169 may vary in accordance with the capacitance of the capacitor 205. That is, the thickness of the third mask layer 169 may be increased or decreased according to the thickness of the mold layer 166. Here, after the mold layer 166 is planarized by a CMP process, an etch back process or a combination process of CMP and etch back, the third mask layer 169 may be formed on the planarized mold layer 166.

Figure 5A:
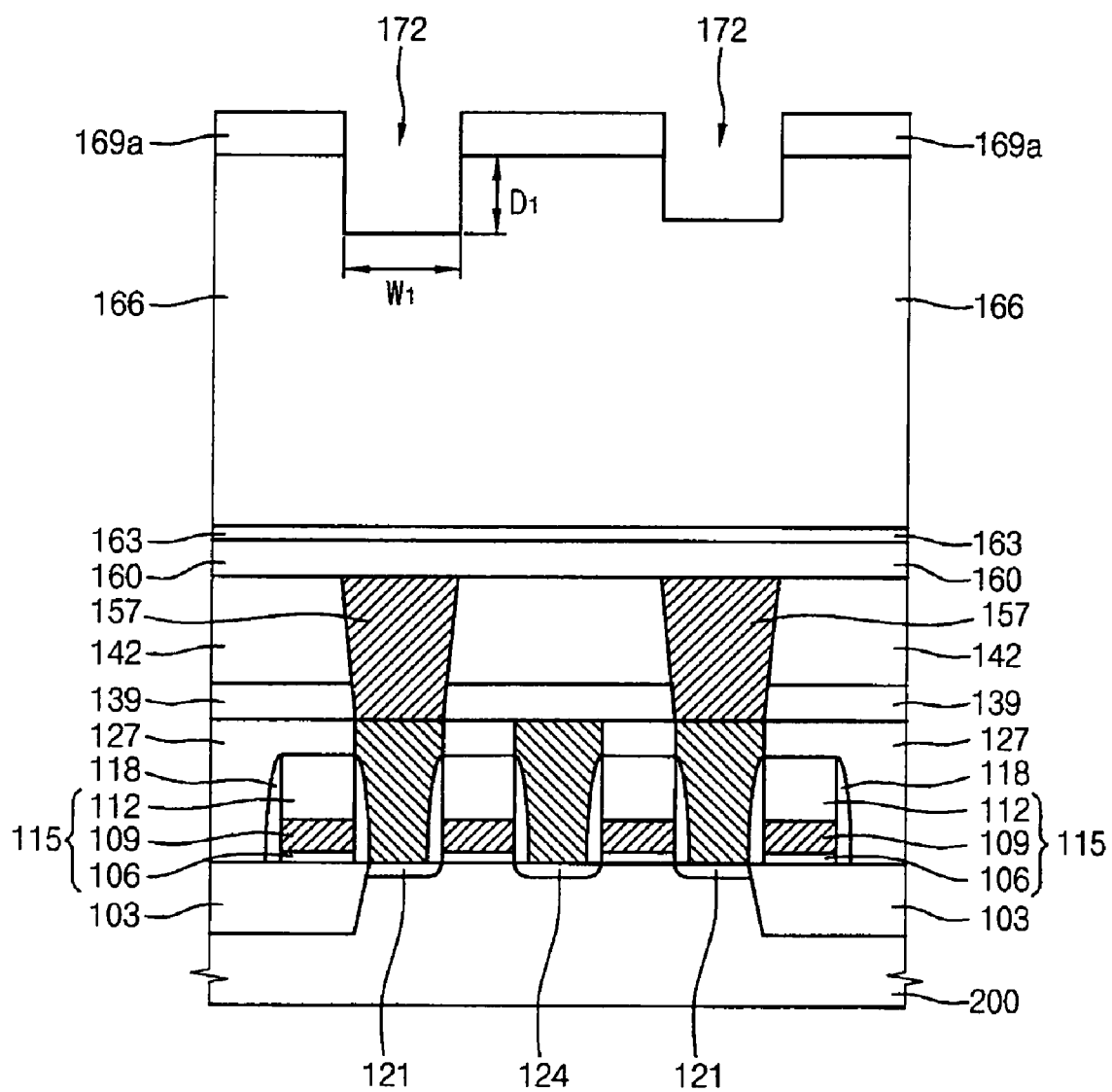
Figure 5B:
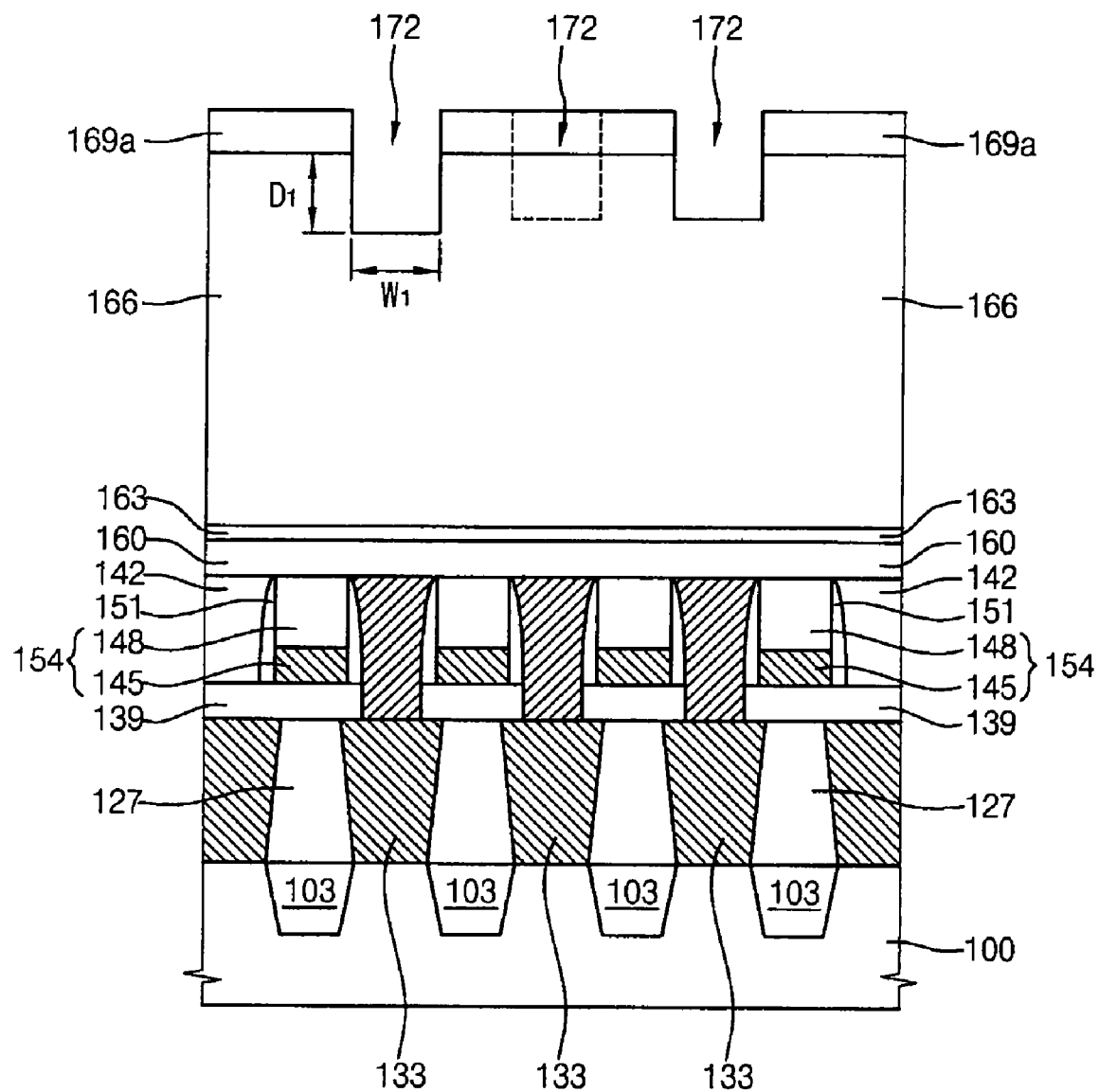
Figure 5C:
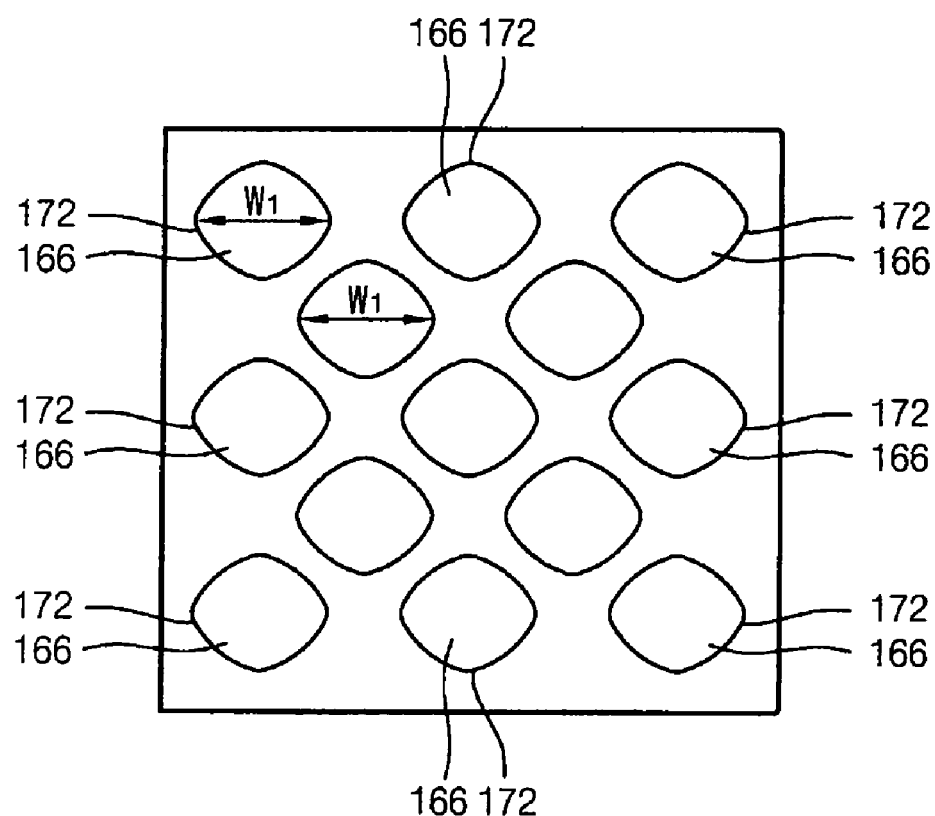
FIGS. 5C, 6C, 8C, and 11C are plan diagrams that further illustrate the semiconductor device of FIGS. 5B, P6B, 8B, and 11B, respectively.

FIGS. 5A and 5B are cross-sectional diagrams illustrating exemplary processes for forming a first opening, and FIG. 5C is a plan diagram illustrating the semiconductor device in FIG. 5B.

Referring to FIGS. 5A to 5C, a sixth photoresist pattern (not shown) is formed on the third mask layer 169. The third mask layer 169 is patterned using the sixth photoresist pattern as an etching mask, thereby forming a storage node mask 169A on the mold layer 166. Then, the sixth photoresist pattern is removed by an ashing and/or stripping process. In one embodiment of the present invention, the sixth photoresist pattern may be removed in an etching process for forming the first openings 172 at the upper portions of the mold layer 166 without performing the ashing and stripping process. Further, to ensure process margin of a subsequent photolithography process, a third ARL may be formed on the third mask layer 169, and then the photolithography process may be performed to form the first openings 172.

A first etching process is performed about the upper portion of the mold layer 166 using the storage node mask 169A as an etching mask to thereby form the first openings 172 at the upper portion of the mold layer 166. The first etching process corresponds to an anisotropic etching process. Each of the first openings 172 has a first width W1 and a first depth D1. The first openings 172 are positioned over the fourth pads 157 and the first pads 133.

As shown in FIG. 5C, the first openings 172 having the first width W1 are separated from one another by predetermined identical intervals. That is, the first openings 172 do not make contact with one another, and are located along a first direction substantially parallel to the bit lines 154. The first openings 172 are also arranged in a second direction that is substantially parallel to the word lines 130.

Figure 6A:
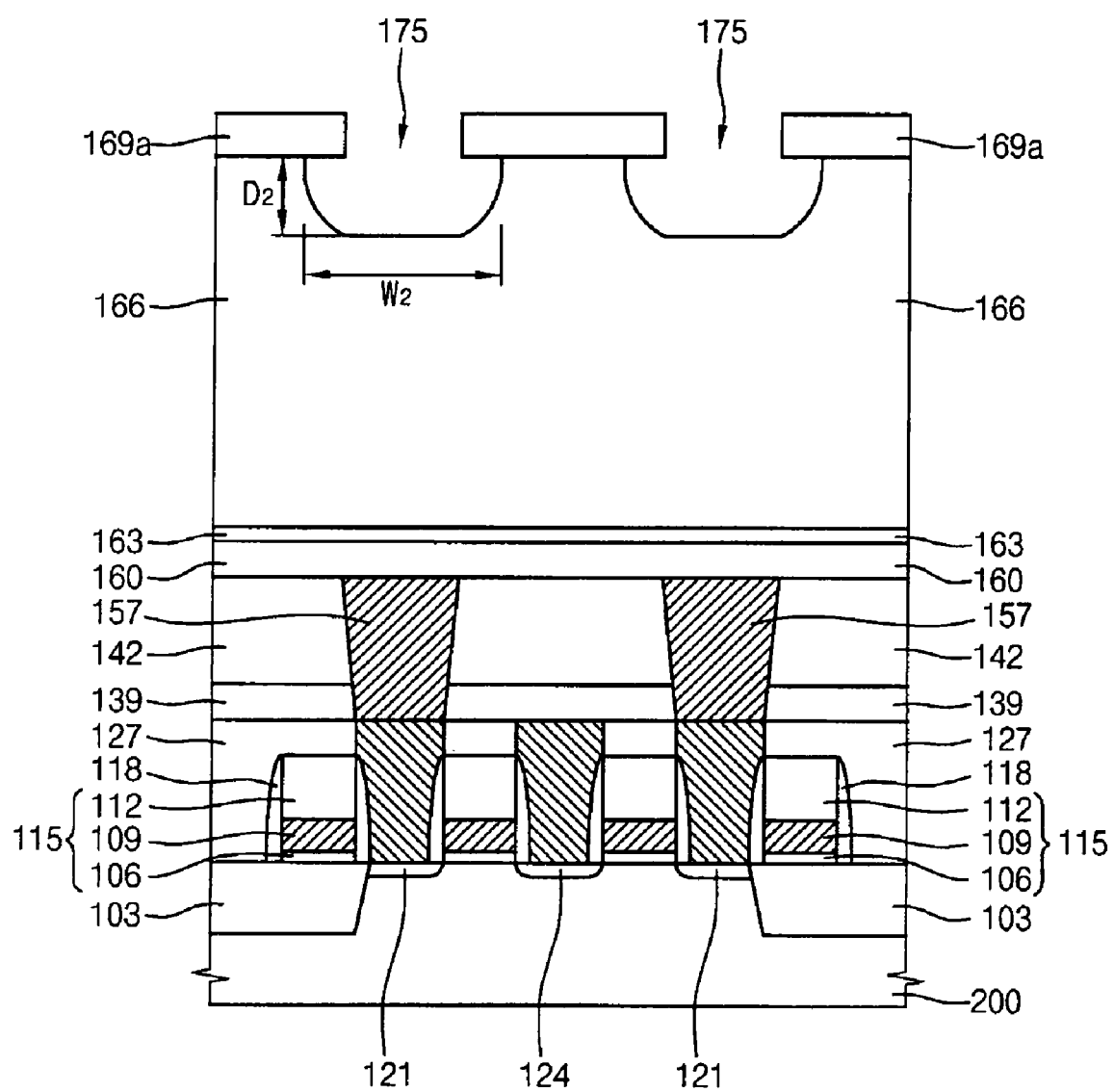
Figure 6B:
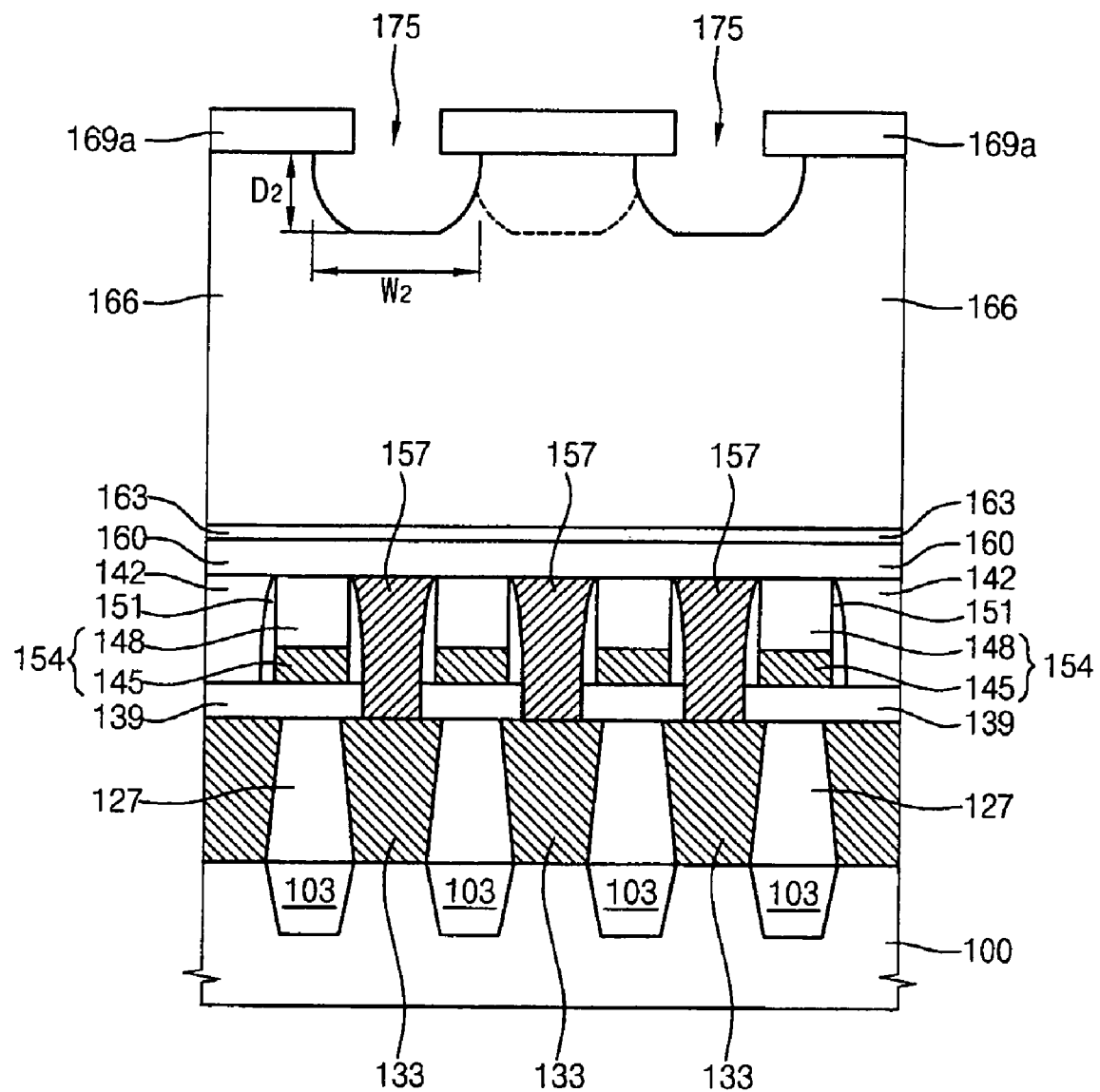
Figure 6C:
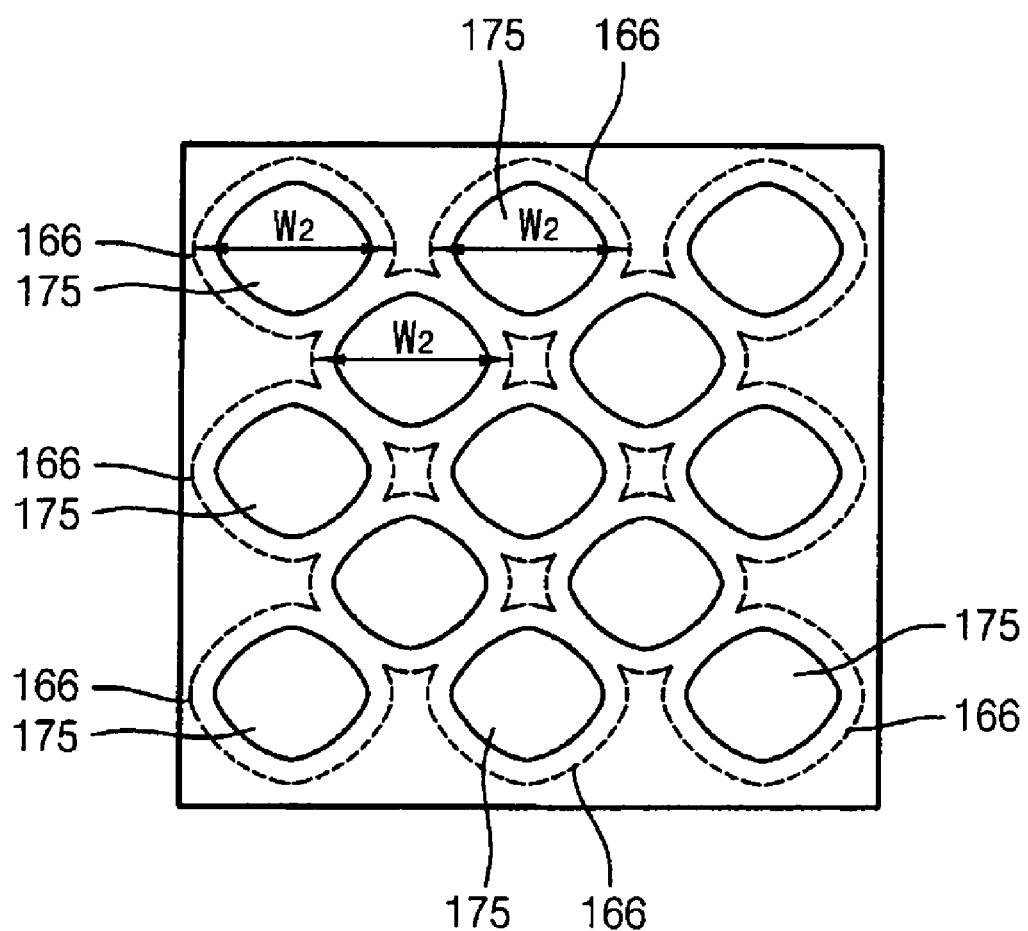

FIGS. 6A and 6B are cross-sectional diagrams illustrating an exemplary process for forming second openings, and FIG. 6C is a plan view diagram illustrating a semiconductor device in FIG. 6B.

Referring to FIGS. 6A to 6C, using the storage node mask 169A as an etching mask, the mold layer 166 including the first openings 175 is etched by a second etching process to form a second openings 175 having a second width $W_2$ and a second depth $D_2$ at the upper portion of the mold layer 166. The second etching process corresponds to an isotropic etching process such as a wet etching process, dry etching process or a plasma etching process. After performing the second etching process corresponding to an isotropic etching process, the first openings 172 are etched to thereby form the second openings 175 having extended dimensions. That is, because sidewalls and bottoms of the first openings 172 are etched in the second etching process, each of the second openings 175 has a second width $W_2$ that is wider than the first width $W_1$, and a second depth $D_2$ that is deeper than the first depth $D_1$. Here, upper portion of the sidewalls of adjacent second openings 175 are in communication with each other, and the sidewalls of the second openings 175 have rounded lower portions with predetermined curvatures. That is, in accordance with the second etching process, the upper portion of each of second openings 175 is connected to one another so that all of the second openings 175 in a single unit cell are in communication with one another. Here, each of adjacent second openings 175 are in communication with each other on a plane having a height that is about ⅓ to about ½ times a sidewalls height of the second openings 175. Therefore, connecting members will have funneled structure that are overlapped about ⅓ to about ½ times a sidewall height of adjacent connecting members 181 so that all of the connecting members 181 in single unit cell will be connected to each other.

As shown in FIG. 6C, since the second openings 175 have the extended second width $W_2$, upper portions of each of adjacent second openings 175 are in communication with one another. That is, the second openings 175 are separated from one another by predetermined identical intervals along a first direction that is substantially parallel to the bit lines 154 or a second direction that is substantially parallel to the word lines 130. However, the adjacent second openings 175 make partial contact with each other along a left slant direction and a right slant direction with respect to the first direction or the second direction. Therefore, all of the second openings 175 formed at the upper portion of the mold layer 166 are partially connected to one another along the left slant and the right slant lines with respect to the first direction or the second direction. Particularly, all of the second openings 175 are partially overlapped about ⅓ to about ½ times a sidewall height of adjacent second openings 175 along the left slant and the right slant direction with respect to the bit lines 154 and the word lines 130.

Figure 7A:
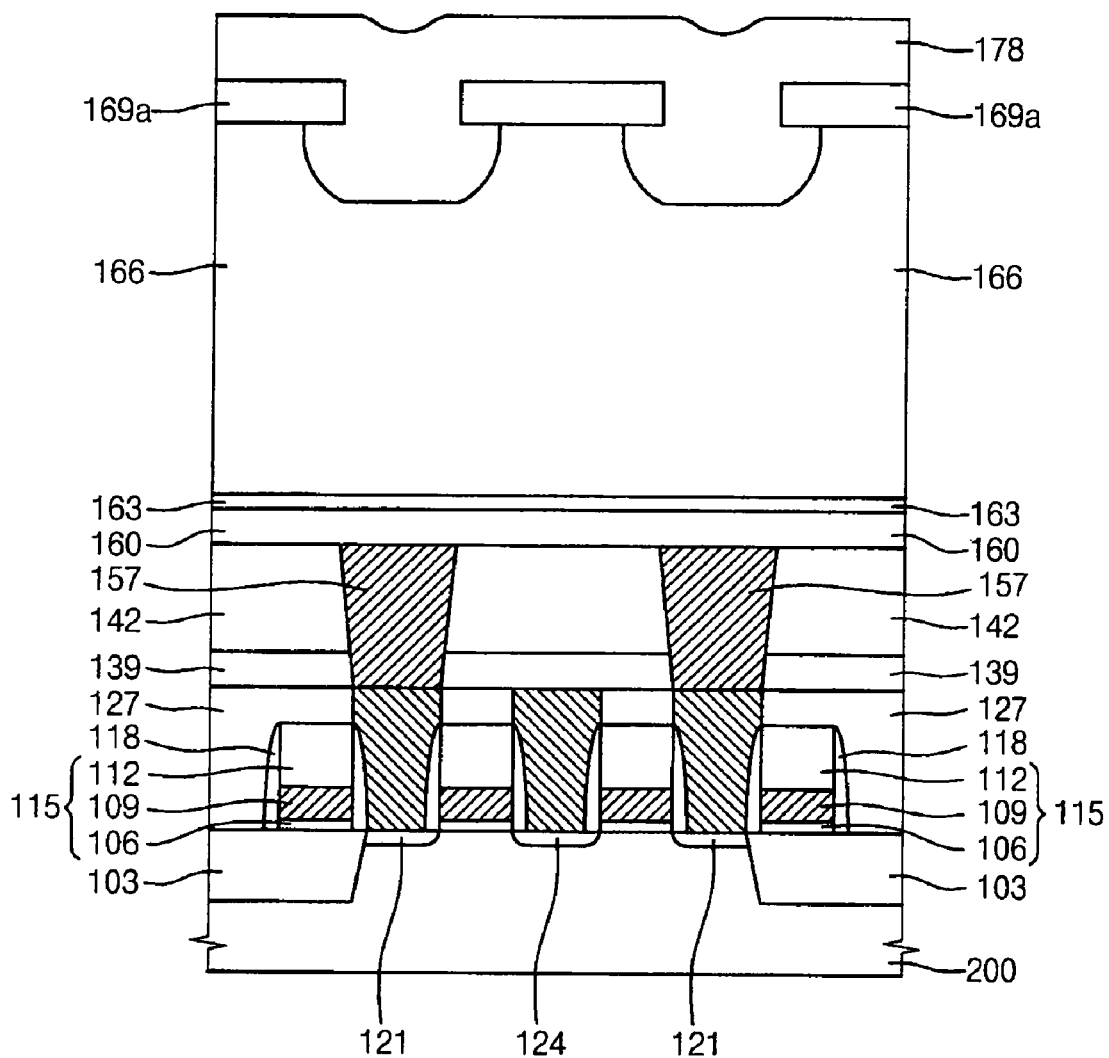
Figure 7B:
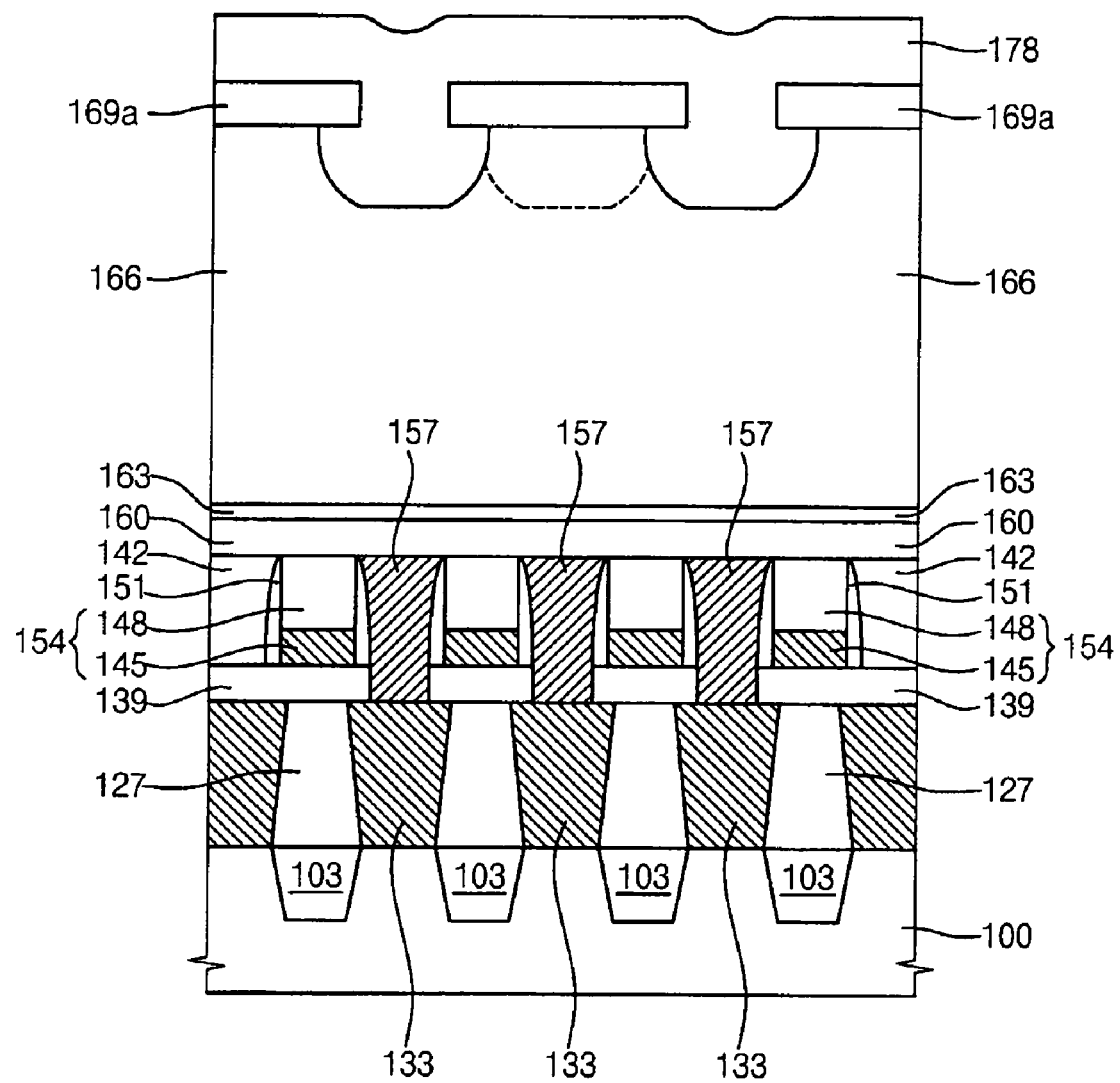

FIGS. 7A and 7B are cross-sectional diagrams illustrating a process for forming a third insulation layer 178.

Referring to FIGS. 7A and 7B, the third insulation layer 178 is formed on the storage node mask 179A filling the second openings 175. The third insulation layer 178 is formed using nitride such as silicon nitride or polysilicon. Preferably, the third insulation layer 178 is formed using material that has an etching selectivity with respect to the storage node mask 169A and the mold layer 166. That is, when the mold layer 166 includes oxide and the storage node mask 169A includes polysilicon, the third insulation layer may include nitride.

FIGS. 8A and 8B are cross-sectional diagrams illustrating a process for forming the connecting members 181 and a fourth contact holes 184, and FIG. 8C is a plan diagram illustrating the semiconductor device in FIG. 8B.

Referring to FIGS. 8A to 8C, the third insulation layer 178 is etched by an anisotropic etching process to thereby form connecting members 181 in the second openings that have an extended diameter. Since, the connecting members 181 are formed around the rounded shape of the second openings 175, the connecting members 181 have a funnel structure with a ring-shaped cross-section over the semiconductor substrate 200. Here, the connecting members 181 connect storage electrodes of the capacitor 205 formed in single unit cell of the semiconductor device. The mold layer 166 is partially exposed by forming the connecting members 181. All of the connecting members 181 in single unit cell are connected with each other. Thus, the capacitors 205 support each other through the connecting members 181 so that capacitors 205 do not fall down although the storage electrodes have a very large aspect ratio.

Referring to FIG. 8C, the connecting members 181 are formed in the second openings 175 that are connected to one another along the left slant and the right slant directions with respect to the first direction or the second direction so that the adjacent connecting members 181 are formed to be connected each other. As a result, all of the connecting members in the unit cell are integrally formed.

As described above, the adjacent connecting members 181 make contact with each other so that all of the connecting members 181 formed at the upper portion of the mold layer 166 are connected to each other.

Referring to FIGS. 8A and 8B, using the storage node mask 169A as an etching mask, the mold layer 166, the etching stop layer 163, and the fourth insulating interlayer 160 are successively etched to form fourth contact holes 184 corresponding to second storage node contact pads. Here, the fourth contact holes 184 have a relatively narrow first diameter $D_1$. In one embodiment of the invention, the mold layer 166 and the fourth insulating interlayer 160 are successively etched, thereby forming the fourth contact holes 184 that have the first diameter $D_1$ without formation of the etching stop layer 163. Here, the connecting members 181 that have the funnel structure with a ring-shaped cross-section over the semiconductor substrate 200 are positioned at the upper portion of the fourth contact holes 184.

Figure 9A:
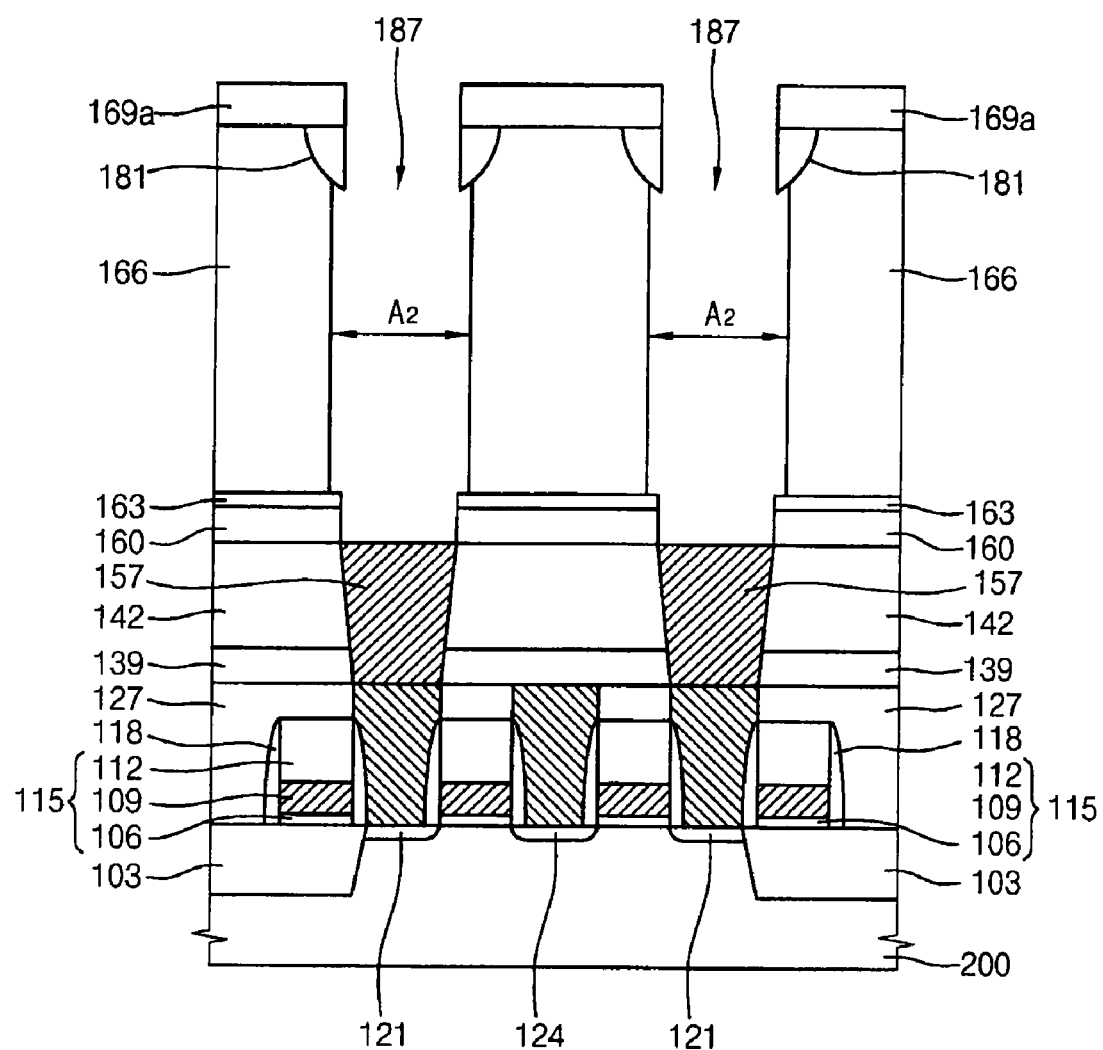
Figure 9B:
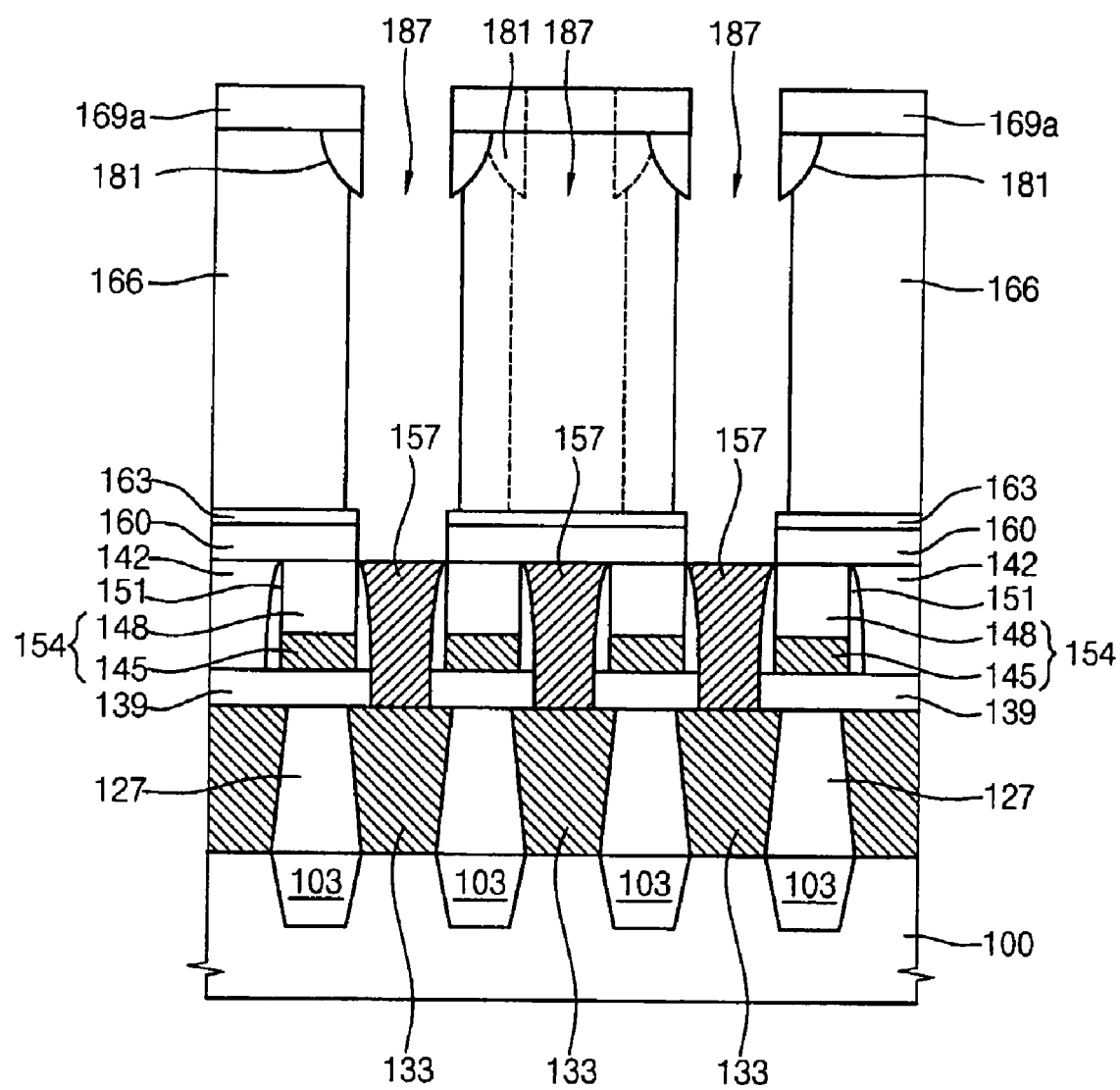

FIGS. 9A and 9B are cross-sectional diagrams illustrating a process for forming fifth contact holes 187.

Referring to FIGS. 9A and 9B, a cleaning process is performed on the semiconductor substrate 200 including the mold layer 166. After the cleaning process is carried out, the fourth contact holes 184 having the first diameter $D_1$ are extended to thereby form the fifth contact holes 187 through the mold layer 166, the fifth contact holes having a second diameter $D_2$. The fifth contact holes 187 correspond to second storage node contact holes. The cleaning process may be performed using a cleaning solution that includes at least two of deionized water, an ammonia solution, and sulfuric acid. The cleaning process may be performed for about 5 to about 20 minutes.

According to embodiments of the invention, the fifth contact hole 187 has a diameter greater than that of the fourth contact hole 184 by about 50 to about 100 nm. Namely, the second diameter $D_2$ of the fifth contact hole 187 is greater than that of the first diameter $D_1$ of the fourth contact hole 184 by about 50 to about 100 nm. For example, in a semiconductor device having a memory storage capacity greater than several gigabytes, a contact hole used for forming a capacitor generally has a diameter of about 100 to about 200 nm. According to embodiments of the invention, an interval between adjacent fifth contact holes 187 may be about 160 to 200 nm along the first direction that is substantially parallel to the bit lines 154. Additionally, an interval between adjacent fifth contact holes 187 may be about 130 to about 170 nm along the second direction that is substantially parallel to the word lines 130. Furthermore, an interval between adjacent fifth contact holes 187 may be about 60 to about 100 nm along the left slant and the right slant directions with respect to the first direction or the second direction. As shown in FIGS. 8A and 9A, the fourth contact hole 184 of the first diameter $D_1$ is etched by the cleaning process to thereby form the fifth contact hole 187 having the extended second diameter $D_2$. Thus, the fifth contact hole 187 has the extended area wider than that of the fourth contact hole 184 by about 50 to about 100 percent. Because the capacitance is proportional to the area of capacitor 205, the capacitor 205 having the fifth contact hole 187 also has a capacitance greater than that of the conventional capacitor by about 50 to about 100 percent.

When the fifth contact holes 187 are formed through the mold layer 166, lower portions of the connecting members 181 are partially or entirely exposed. That is, the lower portions of the connecting members 181 are partially or entirely exposed through the fifth contact holes 187 having the extended diameter. The partially or entirely exposed lower portions of the connecting members 181 are stably supported by the storage conductive layer pattern 193.

Figure 10A:
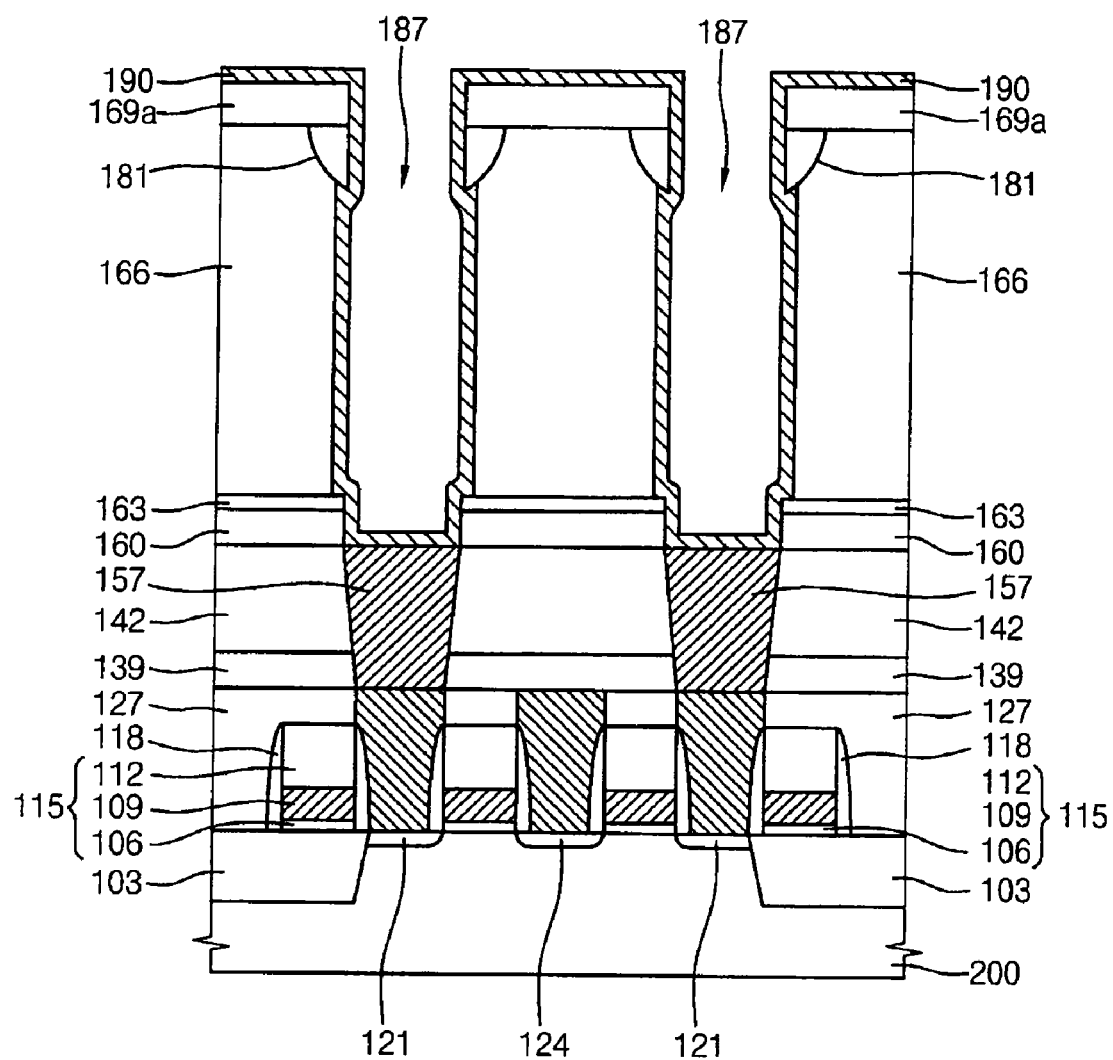
Figure 10B:
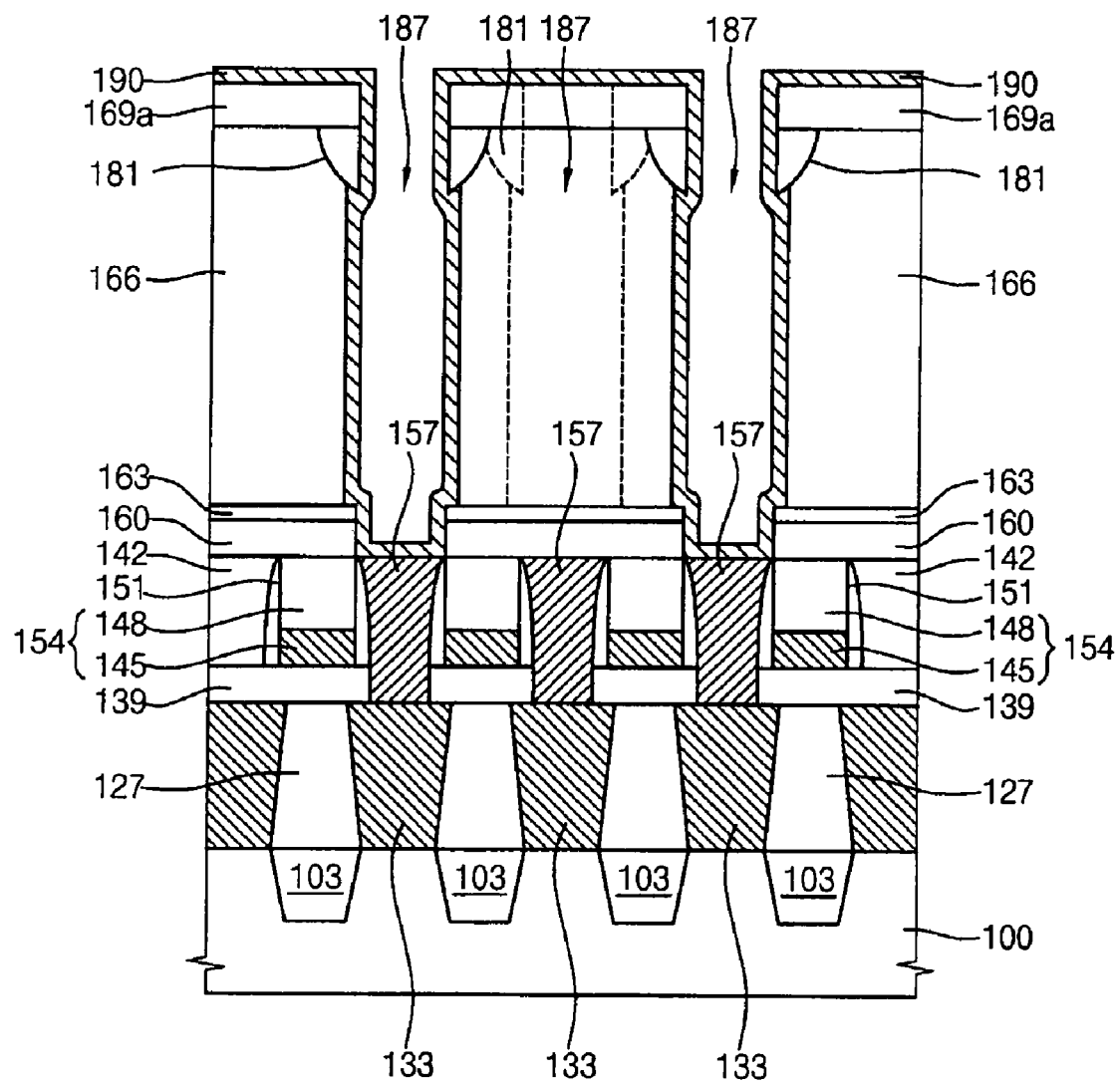

FIGS. 10A and 10B are cross-sectional diagrams illustrating a process for forming a fifth conductive layer 190.

Referring to FIGS. 10A and 10B, the fifth conductive layer 190 is formed on the sidewalls of the extended fifth contact holes 187, on the inner wall of the connecting members 181, the exposed lower portion of the connecting members 181, the fourth pads 157 and the storage node mask 169A. The fifth conductive layer 190 may be formed using conductive material such as doped polysilicon, titanium/titanium nitride, copper, etc. The fifth conductive layer 190 is attached to the sidewalls of the connecting members 181. A bottom face of the connecting members 181 is also supported by the fifth conductive layer 190. Since the fifth conductive layer 190 pressurizes the sidewalls of the connecting members 181 and also supports the bottom face of the connecting members 181, so that the connecting members 181 are fixedly-coupled to the fifth conductive layer 190.

Figure 11A:
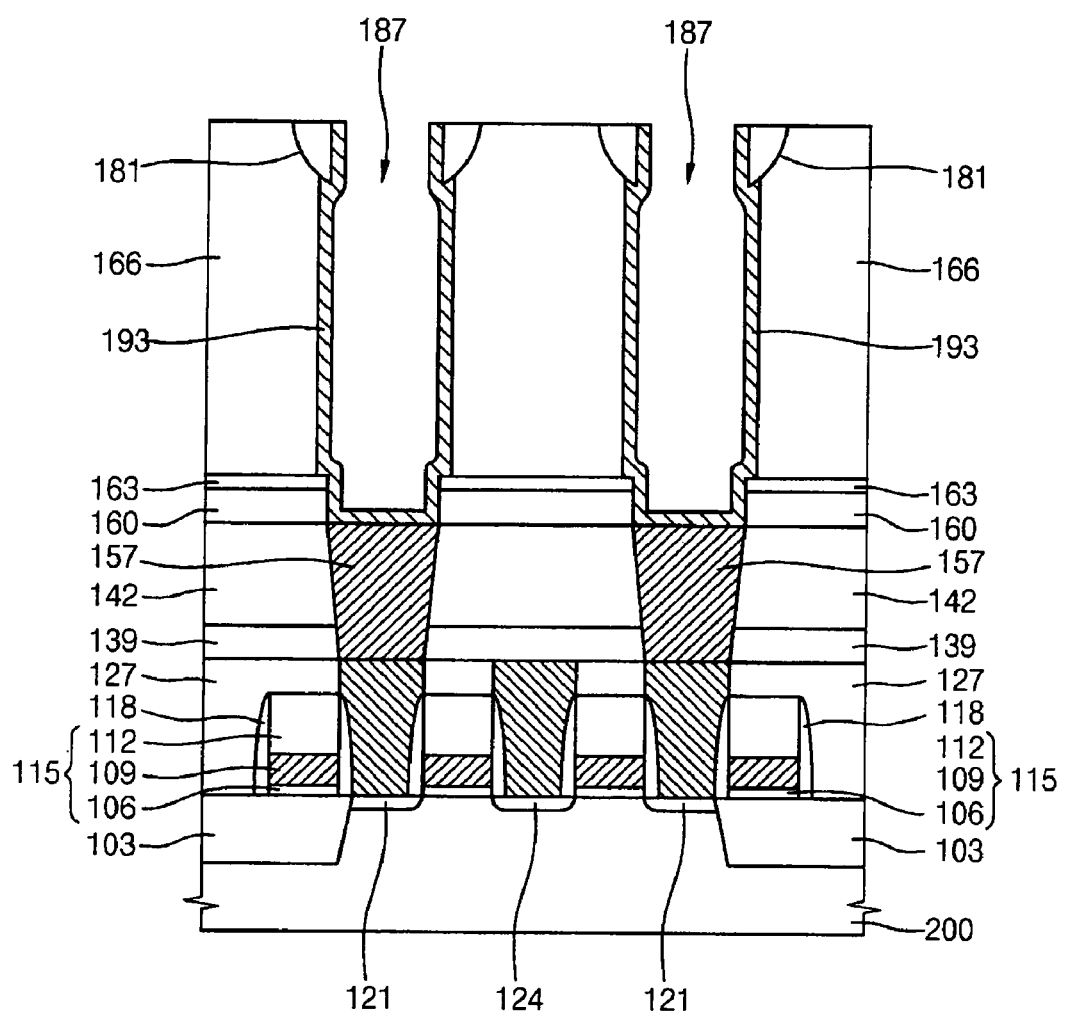
Figure 11B:
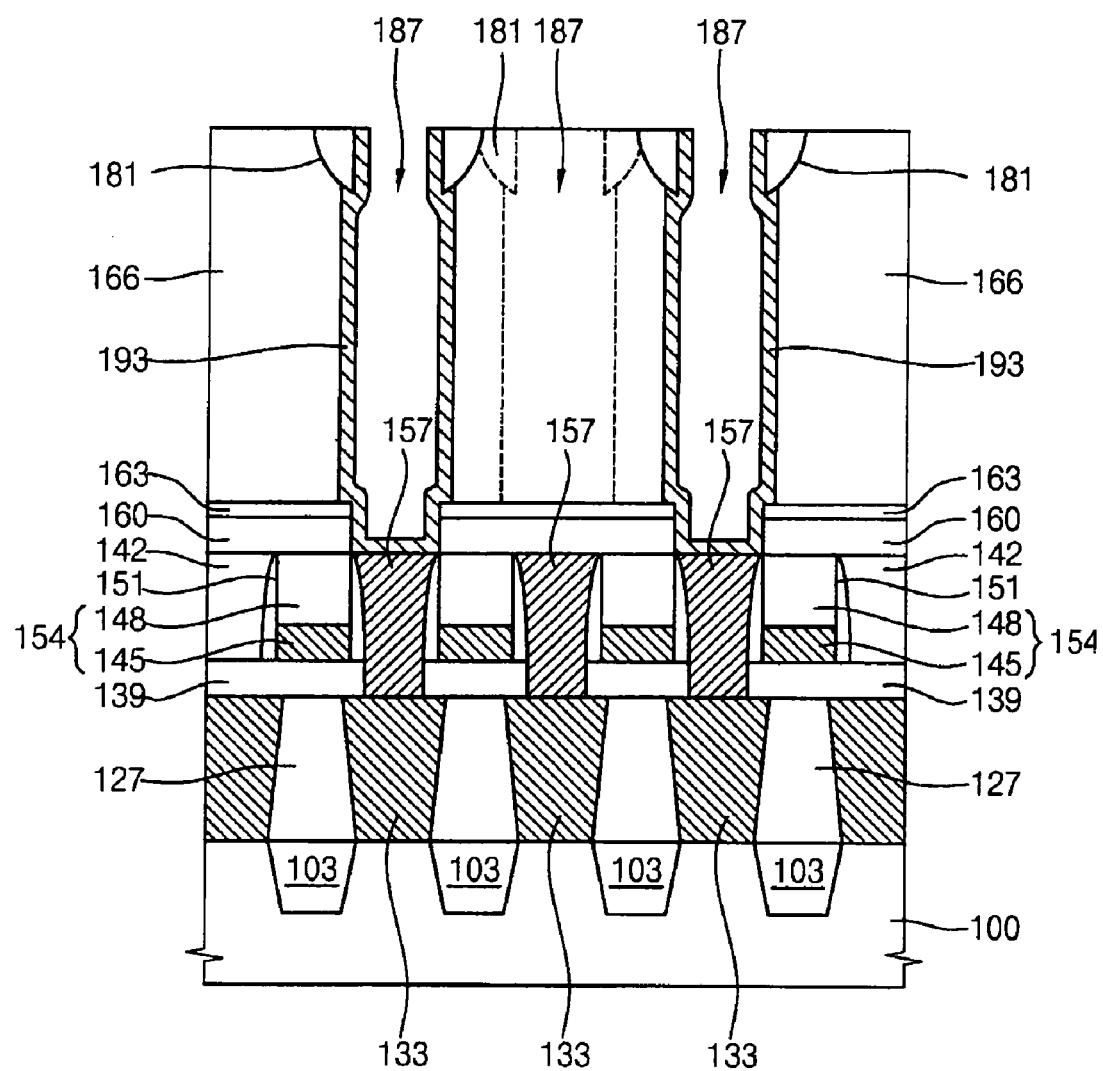
Figure 11C:
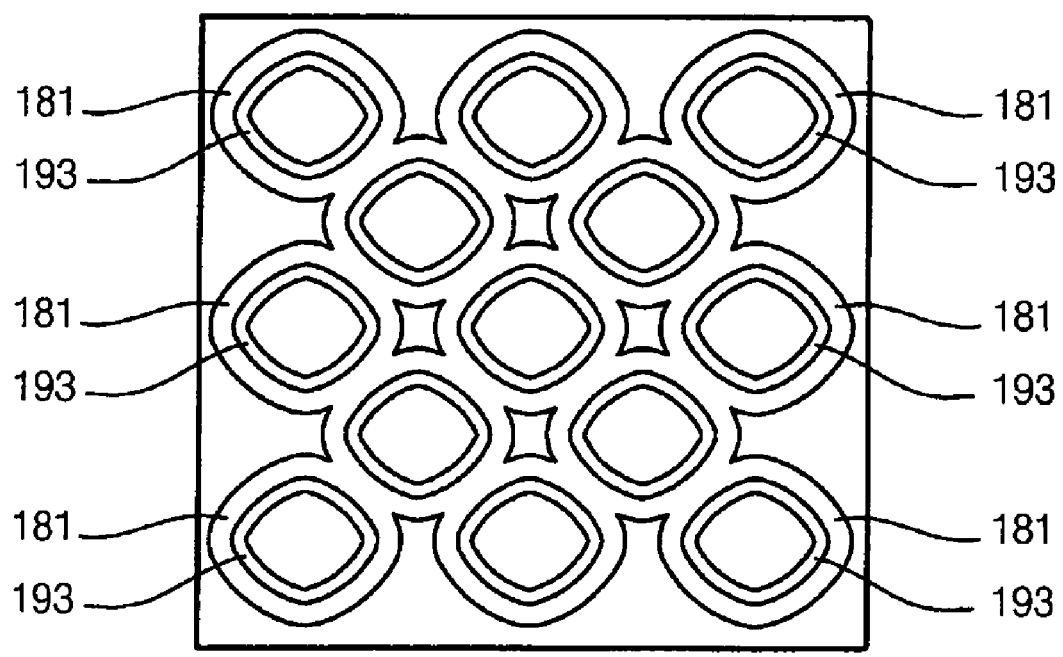

FIGS. 11A and 11B are cross-sectional diagrams illustrating a process for forming a storage conductive layer pattern 196, and FIG. 11C is a plan diagram of the structure illustrated in FIGS. 11A and 11B.

Referring to FIGS. 11A to 11C, the fifth conductive layer 190 and the storage node mask 169A are etched by a CMP process, an etch back process, or a combination process of both CMP and etch back until the mold layer 166 is exposed, thereby forming the storage conductive layer pattern 193. The upper portion of the storage conductive layer pattern 193 is attached to the sidewalls of the connecting members 181 to support the connecting members 181. Also, the lower portion of storage conductive layer pattern 193 contacts the fourth pads 157. Here, the lower portion of storage conductive layer pattern 193 protrudes into the fifth contact holes 187 in accordance with the extension of the fifth contact holes 187. The storage conductive layer pattern 193 has a cylindrical structure. Here, the funnel-shaped connecting members 181 enclose the upper portion of the storage conductive layer pattern 193.

Figure 12:
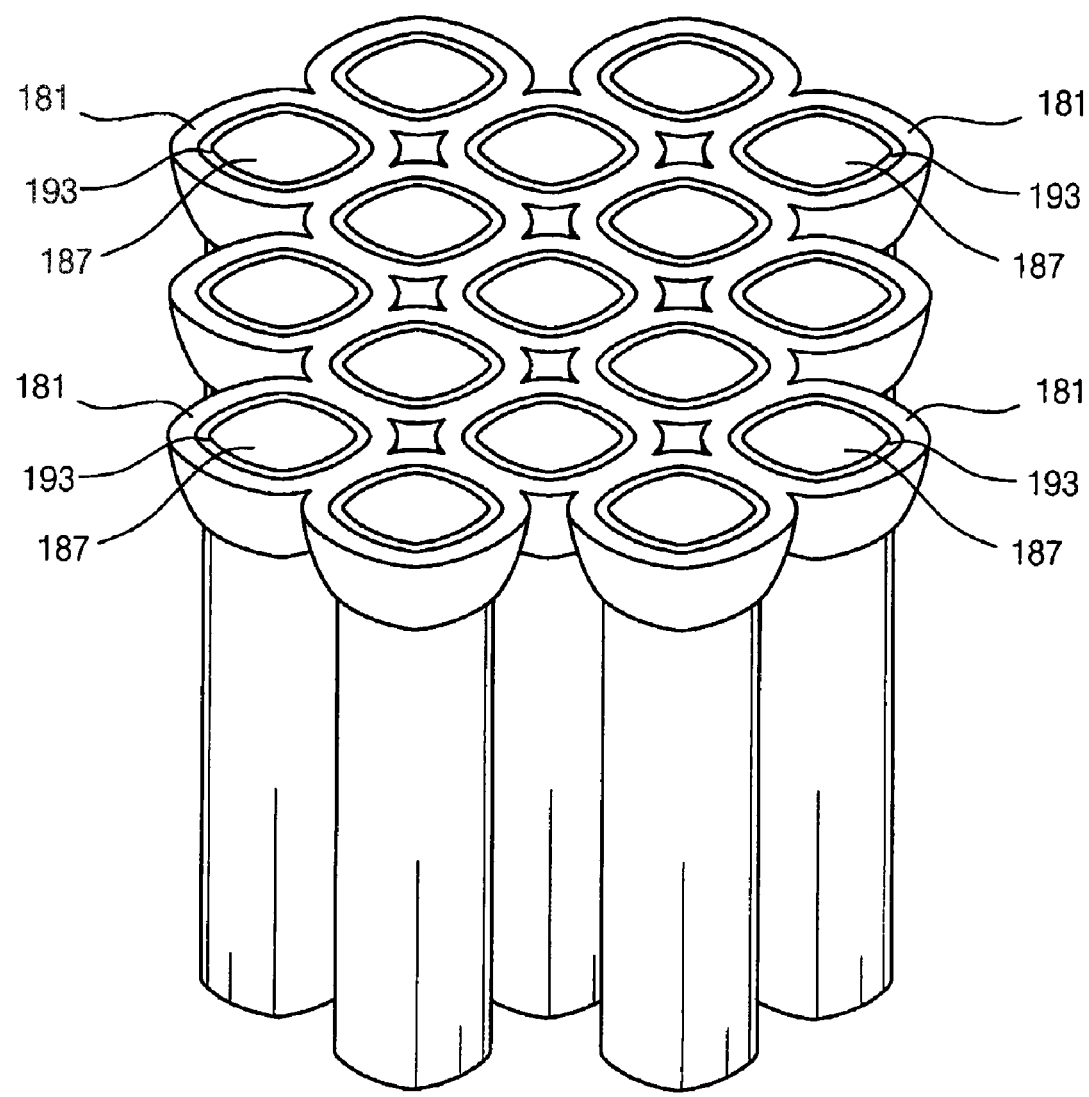
FIG. 12 is a perspective diagram that further illustrates the semiconductor device of FIG. 11B.

FIG. 12 is a schematic perspective diagram illustrating the storage electrodes 196 of the semiconductor device shown in FIGS. 11A, 11B, and 11C.

Referring to FIGS. 11B and 12, since the storage conductive layer pattern 193 supports the bottom portion of the connecting members 181, the connecting members 181 are attached to the storage conductive layer pattern 193 to be supported by the storage conductive layer pattern 193. That is, the upper portion of the storage conductive layer pattern 193 pressurizes the inner wall of the connecting members 181 and simultaneously supports the bottom portion of the connecting members 181. Thus, the connecting members 181 are firmly fixed to the storage electrodes.

According to embodiments of the invention, the connecting members 181 are connected with each other along the left slant and the right slant direction with respect to the first direction or the second direction so that storage electrodes 196 do not fall down in subsequent semiconductor manufacturing processes including a process for forming the storage conductive layer pattern 193 although the storage electrodes 196 have a very large aspect ratio. In addition, the storage conductive layer patterns 193 are formed in the fifth contact holes 187 to have an extended diameter so that the storage electrode 196 may have enlarged areas. As a result, the capacitors may have a greatly improved capacitance as well as stable structures even though the capacitor may be formed in minute area of a semiconductor memory cell.

Figure 13A:
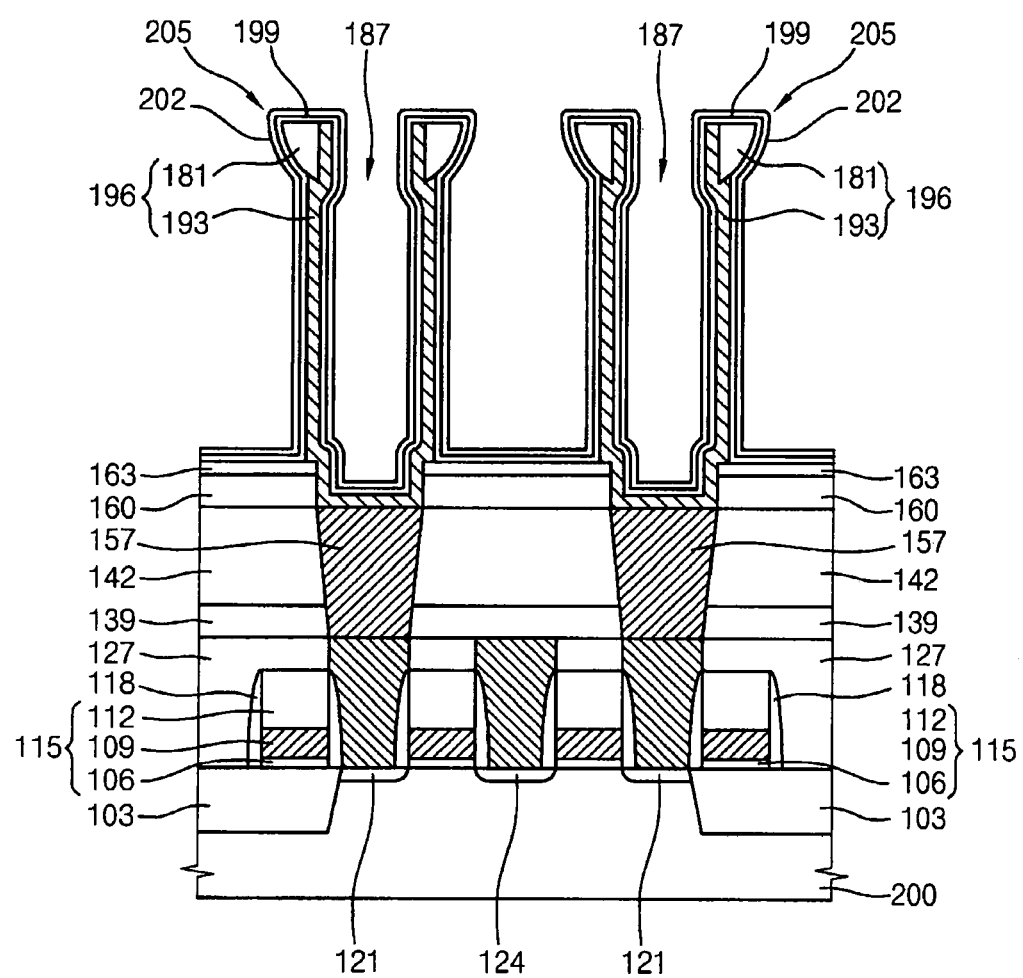
Figure 13B:
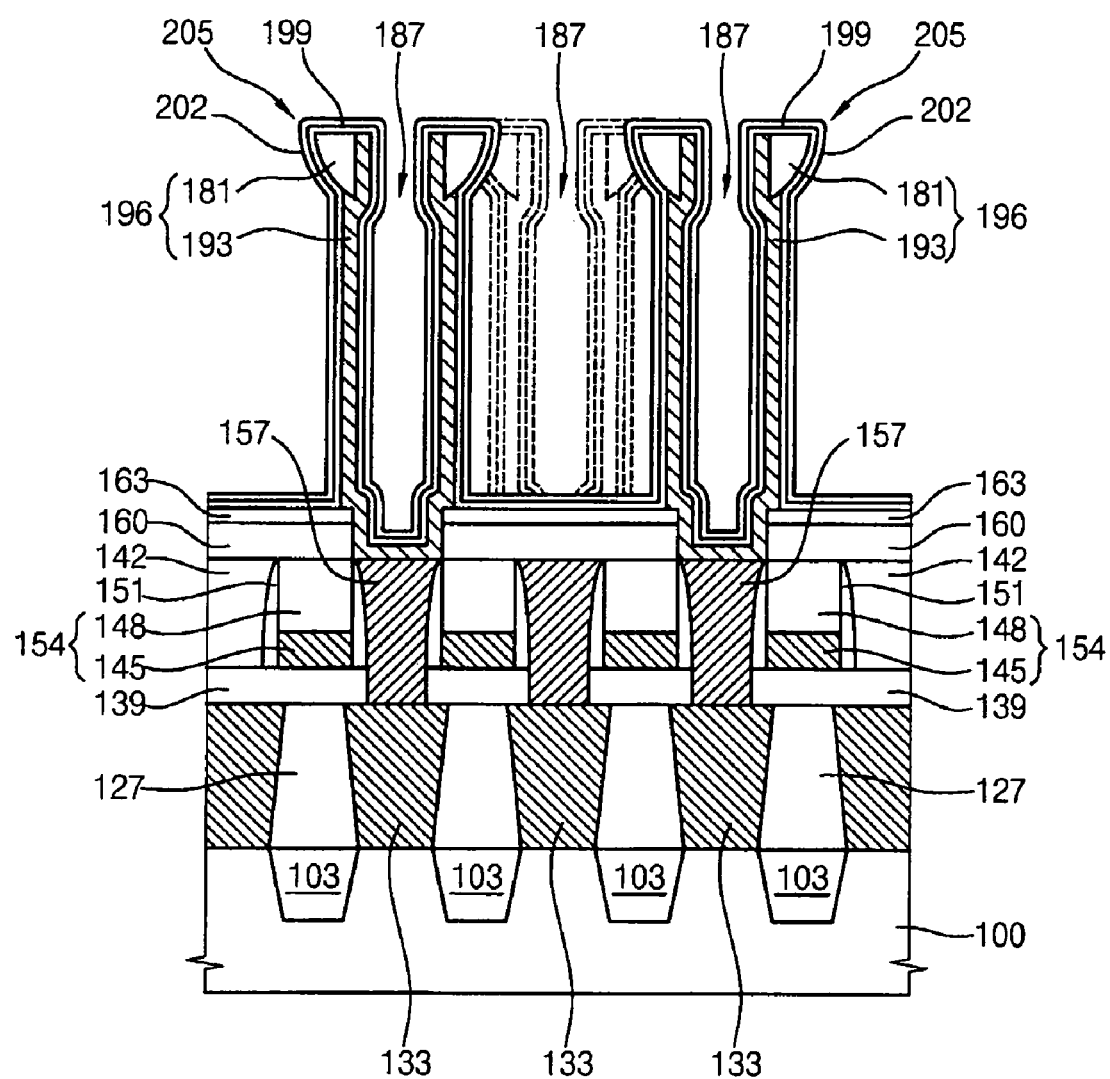

FIGS. 13A and 13B are cross-sectional diagrams illustrating a process for forming the capacitor 205 on the semiconductor substrate 100.

Referring to FIGS. 13A and 13B, the mold layer 166 is removed by a wet etching process or dry etching process to form a cylindrical storage electrode 196 that includes the connecting members 181 and the storage conductive layer pattern 193. As described above, the storage electrode 196 includes the connecting members 181 and the storage conductive layer pattern 193 has increased area and improved structural stability.

A dielectric layer 199 and a plate electrode 202 are successively formed on the storage electrode 196, thereby forming the capacitor 205 over the semiconductor substrate 100. According to embodiments of the invention, all of the storage electrodes 196 of the capacitors 205 in one unit cell are connected to one another through the connecting members 181 along the left slant and the right slant direction with respect to the first direction or the second direction so that storage electrodes 196 do not fall down. Also, the storage conductive layer pattern 193 is formed using doped polysilicon or metal such that the capacitors 205 may be advantageously employed for an silicon-insulator-silicon (SIS) structure, metal-insulator-metal (MIM) structure, metal-insulator-silicon (MIS) structure, etc.

A fifth insulating interlayer (not shown) is formed on the capacitors 205 to electrically isolate the capacitors from an upper wiring (not shown) that are successively formed thereon. When the upper wiring is formed on the fifth insulating interlayer, the semiconductor device that includes the capacitors 205 is completed.

According to embodiments of the invention, storage electrodes that include storage conductive layer patterns and connecting members are formed so that the storage electrodes of a unit cell are supported by one another. Thus, the storage electrodes may not fall-down when the capacitors have an extremely large aspect ratio. Furthermore, the capacitance of the capacitors may be improved to the desired level and, 2-bit failures between capacitors due to the mechanical fall-down of the capacitors may be prevented. As a result, a semiconductor device having these capacitors may have improved reliability and the throughput of the semiconductor device manufacturing process may be increased.

In addition, the capacitor has an enlarged area that includes the storage conductive layer pattern that has extended area because the storage conductive layer pattern is formed in the extended storage node contact hole. Thus, the capacitors may have an improved capacitance.

The invention may be practiced in many ways. What follows are exemplary, non-limiting descriptions of some embodiments of the invention.

According to some embodiments, a capacitor includes a cylindrical storage electrode, a dielectric layer formed on the storage electrode, and a plate electrode formed on the dielectric layer. Here, each of the storage electrodes includes a cylindrical conductive layer pattern, and a connecting member formed at the upper portion of the cylindrical storage conductive layer pattern. The connecting members of each of the storage electrodes are connected to each other. Preferably, all of the storage electrodes in a unit memory cell are connected to one another through the connecting members. Here, the adjacent connecting members are connected to each other along a slant direction with respect to a direction in which the storage electrode and an adjacent electrode are arranged.

According to other embodiments, a method of manufacturing a capacitor includes forming a contact region on a surface portion of a semiconductor substrate. A mold layer is formed on the substrate. An opening is formed at a portion of the mold layer that is positioned over the contact region. A connecting member is formed on an inner wall of the opening to connect adjacent electrodes to one another. A contact hole is formed through the mold layer to expose the connecting member and the contact region. A storage conductive layer pattern is formed on inner walls of the connecting member and the contact hole to connect the storage conductive layer pattern to the contact region. The mold layer is removed to thereby form a storage electrode that includes the connecting member and the storage conductive layer pattern. A dielectric layer is formed on the storage electrode. A plate electrode is then formed on the dielectric layer.

According to other embodiments, a semiconductor device includes word lines formed on a substrate. First and second contact regions are disposed at surface portions of the substrate between the word lines, respectively. A first pad makes contact with the first contact region. A second pad makes contact with the second contact region. A bit line makes contact with the second pad. A storage electrode includes a cylindrical conductive layer pattern making contact with the first pad, and a connecting member formed at an upper portion of the storage conductive layer pattern. A dielectric layer is formed on the storage electrode. A plate electrode is formed on the dielectric layer. Here, all of the storage electrodes of a unit memory cell are connected to one another through the connecting members.

According to other embodiments, a method of manufacturing a semiconductor device includes forming word lines on a substrate. First and second contact regions are formed at surface portions of the substrate between the word lines, respectively. First pads are formed to make contact with the first contact region. Second pads are formed to make contact with the second contact region. Bit lines are formed to make contact with the second pad. A mold layer is formed on the substrate to cover the bit lines. Openings are formed at portions of the mold layer that are positioned over the first pads. Connecting members are formed on an inner wall of the openings to connect adjacent storage electrodes to one another. Contact holes are formed to expose the inner walls of the connecting member and the first pad. A storage conductive layer pattern is formed on the inner walls of the connecting member and the inner wall of the contact hole and on the first pad. The mold layer is removed to thereby form a storage electrode including the connecting member and the storage conductive layer pattern. A dielectric layer and a plate electrode are successively formed on the storage electrode.

According to embodiments of the invention, the storage electrodes including the storage conductive layer patterns and the connecting members are formed so that the storage electrodes of a unit cell are supported by one another. Thus, the storage electrodes may be prevented from falling down even though the capacitors have an extremely large aspect ratio. Furthermore, the capacitance may be improved to the desired level and 2-bit failures between capacitors due to the mechanical fall-down of the capacitors may be prevented. As a result, a semiconductor device including the capacitors may have improved reliability and the throughput of a semiconductor manufacturing process may be increased. In addition, the capacitor has an enlarged area that includes the storage conductive layer pattern that has an extended area because the storage conductive layer pattern is formed in the extended storage node contact hole. Thus, the capacitors may have improved capacitance.

Having thus described exemplary embodiments of the invention, it is to be understood that the invention defined by the appended claims is not to be limited by particular details set forth in the above description as many apparent variations thereof are possible without departing from the spirit or scope thereof as hereinafter claimed.

I claim:

1. A capacitor comprising:
a storage electrode having a cylindrical storage conductive layer pattern and a connecting member formed at an upper portion of the cylindrical storage conductive layer pattern, the connecting member integral with an adjacent connecting member from another storage electrode, the storage electrode and the another storage electrode are part of a unit memory cell;
a dielectric layer disposed on the storage electrode; and
a plate electrode disposed on the dielectric layer.

2. The capacitor of claim 1, wherein all of the storage electrodes in the unit memory cell are connected to one another through the connecting member and the adjacent connecting member.

3. The capacitor of claim 2, wherein the connecting member and the adjacent connecting member are integrally formed along a slant direction with respect to a direction along which the storage electrodes are arranged.

4. The capacitor of claim 1, wherein the storage electrodes have a funnel-shaped structure.

5. The capacitor of claim 4, wherein the connecting member comprises a sidewall that is pressed by the storage conductive layer pattern, and a bottom face that is supported by the storage conductive layer pattern.

6. The capacitor of claim 4, wherein the connecting member encloses an upper portion of the storage conductive layer pattern.

7. The capacitor of claim 4, wherein the connecting member has a ring-shaped cross-section in a horizontal plane.

8. The capacitor of claim 4, wherein the storage conductive layer pattern comprises a lower portion that protrudes inwardly.

9. A semiconductor device comprising:
word lines formed on a semiconductor substrate;
a first contact region and a second contact region formed on of the substrate between the word lines;
a first pad contacting the first contact region;
a second pad contacting the second contact region;
a bit line contacting the second pad;
a storage electrode including a cylindrical storage conductive layer pattern that contacts the first pad, and a connecting member formed at an upper portion of the cylindrical storage conductive layer pattern, the connecting member integrally formed with an adjacent connecting member of another storage electrode;
a dielectric layer formed on the storage electrode; and
a plate electrode formed on the dielectric layer.

10. The semiconductor device of claim 9, wherein the connecting member and an adjacent connecting member are integrally formed along a slant direction with respect to a direction along which the storage electrodes are arrayed.

11. The semiconductor device of claim 9, wherein the connecting member has a funneled structure.

12. The semiconductor device of claim 11, wherein the storage conductive layer pattern comprises an inwardly protruding lower portion.

13. The semiconductor device of claim 11, wherein the connecting member comprises:
a sidewall attached to the storage conductive layer pattern; and
a bottom face supported by the storage conductive layer pattern.

* * * * *